United States Patent [19]
Koshiro et al.

[11] Patent Number: 5,768,326
[45] Date of Patent: Jun. 16, 1998

[54] PLL CIRCUIT AND METHOD

[75] Inventors: Natsuki Koshiro; Atsushi Hirota; Noriya Sakamoto, all of Kanagawa-ken, Japan

[73] Assignee: Kabushiki Kaisha Toshiba, Kawasaki, Japan

[21] Appl. No.: 631,198

[22] Filed: Apr. 12, 1996

[30] Foreign Application Priority Data

Apr. 14, 1995 [JP] Japan .................................. 7-114016

[51] Int. Cl.⁶ ...................................................... H03D 3/24
[52] U.S. Cl. ............................ 375/376; 375/373; 327/156
[58] Field of Search ................................. 375/376, 373, 375/375, 327, 365; 331/18, 25; 327/147, 156, 160; 348/537, 735, 500

[56] References Cited

U.S. PATENT DOCUMENTS

| | | | |
|---|---|---|---|
| 5,287,182 | 2/1994 | Haskell et al. ........................ | 375/376 |
| 5,543,853 | 8/1996 | Haskell et al. ........................ | 348/497 |

OTHER PUBLICATIONS

"System Time Clock Recovery in the Decoder", ISO/IEC 13818-1, ANNEX 3, D.0.3, ISO/IEC JTC1/SC29/WG11: Nov. 13, 1994, pates 112–115.

*Primary Examiner*—Stephen Chin
*Assistant Examiner*—Betsy L. Deppe
*Attorney, Agent, or Firm*—Cushman Darby & Cushman IP Group of Pillsbury Madison & Sutro LLP

[57] ABSTRACT

A PLL circuit for use in a digital broadcasting receiver includes a receiver for receiving a bit stream containing program clock references (PCRs) transmitted from a broadcast station. The PCRs correspond to a frequency and phase of a transmitter system clock. The circuit also contains an oscillator for generating receiver system clocks, a counter responsive to the system clocks, and a connection to allow the bit stream to flow from the receiver to the oscillator. A controller controls the counter based on differences between the PCRs in the bit stream and the counter output. A load control means successively loads the PCRs on the counter in their order of transmission to lock the frequency and phase of the receiver system clock provided from the oscillator with the frequency and phase of the transmitter system clock. This arrangement allows quick adjustment of the receiver system clock frequency and phase by removing the influence of the insertion intervals of the PCRs in the bit stream when making the adjustment.

18 Claims, 21 Drawing Sheets

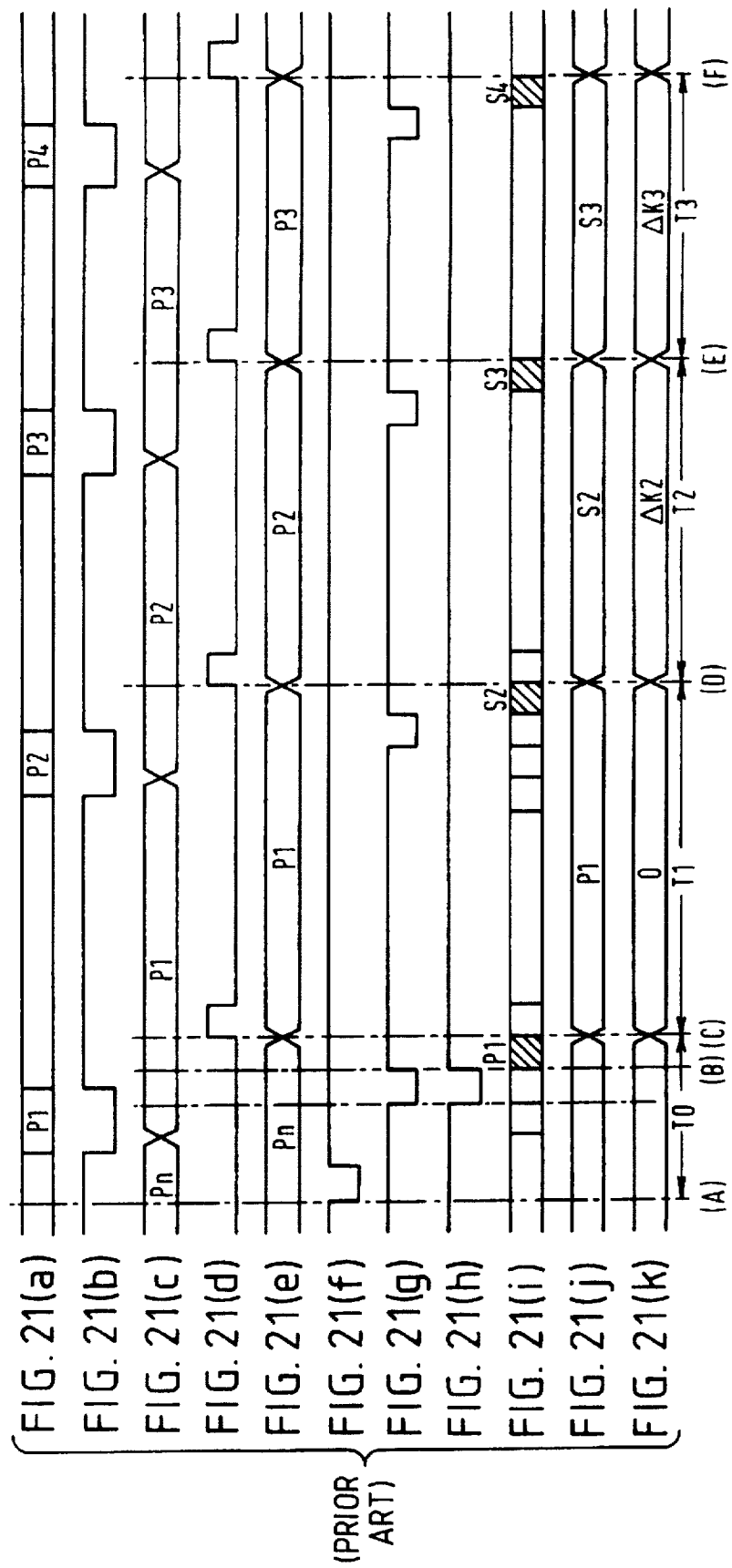

PLL CIRCUIT AND METHOD

FIELD OF THE INVENTION

The present invention generally relates to a PLL circuit and method used in receivers in a digital broadcasting systems for obtaining clocks synchronized with system clocks at a transmitter in the digital broadcasting system from a system clock regenerating signal extracted from a bit stream.

BACKGROUND OF THE INVENTION

In conventional digital broadcasting systems, a transmission architecture for multiplexing signals such as a video signal, an audio signal, a data signal, etc. to transmit them as a bit stream has been established. In this transmission system, the receiver must reproduce system clocks synchronized with the transmission side and perform the signal processing. So, signals required for reproducing the system clocks are transmitted by inserting them in a bit stream at a proper interval. In the receiver, these signals are extracted from the bit stream and clocks synchronizing the system clocks at the transmitter are obtained by a PLL (Phase Lock Loop) processing.

The broadcasting in accordance with the ISO/IEC 13818 (hereinafter referred to as the MPEG.2) is highlighted for the digital broadcasting. In this MPEG.2 system, signals such as video signals, audio signals, data signals, etc. are packetized, multiplexed and transmitted as a transport stream.

At the transmitter, program clock references (hereinafter referred to as PCRs) are placed in the transport stream at a proper interval as a signal served for the receiver to reproduce clocks which are synchronizing with the system clocks at the transmitter. This PCR is an output of a counter which runs under a control of the system clocks.

The PCRs are placed in respective transport streams divided into a program clock reference base (hereinafter referred to as PCR.b) and a program clock reference extension (hereinafter referred to as PCR.ex). The PCR, PCR.b and PCR.ex have the following relationship:

$$PCR = PCR.b \times 300 + PCR.ex \quad (1)$$

Hereinafter, this sort of conventional system will be explained as to an MPEG2 system.

FIG. 19 shows a PLL circuit for a system proposed in the MPEG2 system. In FIG. 19, the transport stream described above is applied to a terminal 11. A program selecting signal showing a program which is selected by a user is applied to a terminal 12, and a power ON reset signal showing the initialization at the time of power ON is applied to a terminal 13.

The transport stream which has been applied to the terminal 11 is further applied to a PCR extractor 14. Further, the program selecting signal applied to the terminal 12 is further applied to both the PCR extractor 14 and a program switching signal generator 15 and is converted to a program switching signal which generates pulses when a program is switched.

In the PCR extractor 14, the PCR of the program directed to select by the program selecting signal is extracted from the input transport stream, and at the same time, a PCR field detection signal showing portions of the transport stream in which the selected program PCRs have been inserted and a time base switching signal showing the completion of the time-base switching are output.

Here, if the program is changed, the time base generally changes and the assignment of PCR also changes. Further, the time base switching signal changes to a signal containing pulses at timings where the time base changes.

The PCR field detection signal output from the PCR extractor 14 is applied to a timing signal generator 16. This timing signal generator 16 generates various timing signals, e.g., a master timing signal, a load timing signal, etc. from the PCR field detection signal.

The PCR extracted by the PCR extractor 14 is transmitted to a latch 17 where it is latched by a master timing signal from the timing signal generator 16. This latch signal is applied to a subtractor 21.

The arrangement of the PCR extractor 14 is shown in FIG. 20. A transport stream input through the terminal 11 is applied to a packet ID selecting circuit 141, a depacketizer 142 and a PCR field extractor 143. Further, a program selecting signal input through the terminal 12 is applied to the packet ID selector 141.

Here, a packet ID is a specific ID assigned by program according to respective transport streams of video, audio, data, etc.

In the packet ID selector 141, a program signal showing a program stream in which the PCR is inserted is captured from the transport stream. Then, a packet ID is extracted from the captured program signal by discriminating a transport stream in which a user-selected program PCR is inserted based on a program selecting signal. The packet ID output from this packet ID selector 141 is applied to the depacketizer 142.

This depacketizer 142 first detects a packet having the packet ID, which is output from the packet ID selector 141, from a transport stream. Then, a header of the detected packet is analyzed to judge a location where a PCR is placed in the detected packet. Then based on the result of this analysis, the depacketizer 142 outputs a PCR field detection signal showing a location in the transport stream where the PCR is placed. Further, by analyzing the header of the detected packet, a discontinuity indicator serving as a flag related to a time base is detected and by checking the state of this flag, whether a time base is switched is judged. If a time base has switched, a time base switching signal pulse is output.

The PCR field detection signal which is output from this depacketizer 142 is applied to both the PCR field extractor 143 and the timing signal generator 16. Further, a time base switching signal is supplied to an AND gate of a load controller 18.

In the PCR field extractor 143, an operation to extract a PCR field from a transport stream is carried out according to the PCR field detection signal. The PCR extracted in the PCR field extractor 143 is transmitted to the latch 17 and a counter 19 as an output of the PCR extractor 14.

In the counter 19, the PCR which is output from the PCR extractor 14 is loaded under a control of a load control signal output from the load controller 18 and performs the counting operation by system clocks output from a VCXO (voltage controlled oscillator) 23, and an output of this counter 19 is applied to a latch 20 and is latched therein by the master timing signal output from the timing signal generator 16. The count latched by the latch 20 is applied to a subtractor 21.

In the subtractor 21, a difference between a value of the PCR output from the latch 17 and the count of the counter 19 output from the latch 20 is calculated. A difference output from the subtractor 21 is converted to a voltage signal by a low-pass filter (LPF) and applied to the VCXO 23 as a frequency control signal. Therefore, a system clock with a frequency corresponding to the difference between the PCR and the output of the counter 19 is output from the VCXO.

The load controller 18 is comprised of the AND gate 181 and a load control signal generator 182.

In the AND gate 181, an AND logic (logical product) is operated by inputting a time base switching signal output from the PCR extractor 14, the program switching signal output from the program switching signal generator 15 and the power ON reset signal input from the terminal 13. The calculation result of the AND logic is applied to the load control signal generator 182.

In the load control signal generator 182, a load control signal is generated from the master timing signal and the load timing signal which are output from the timing signal, generator 16, and the output signal of the AND gate 181. This load control signal is applied to the counter 19.

FIG. 21 is a timing chart showing output timings of major parts of the PLL circuit shown in FIG. 19. Hereinafter, the operation of the PLL circuit with the arrangement as described above will be explained referring to FIG. 21.

FIG. 21(a) shows a transport stream which is input through the terminal 11. This transport stream has PCRs of a user-selected program inserted at the locations P1, P2, P3 and P4.

FIG. 21(b) shows the PCR field detection signal which is output from the PCR extractor 14. This PCR field detection signal in synchronism with the transport stream shows portions of the transport stream in which the PCRs are inserted by outputting it at a low level for the duration in which the PCR is inserted. So, the PCR field detection signal shown in FIG. 2(b) is at the low level in the durations of P1, P2, P3 and P4 of the transport stream shown in FIG. 21(b).

FIG. 21(c) shows the output of the PCR extractor 14. That is, in the PCR extractor 14, the P1, P2, P3 and P4 which are the PCRs of a user-selected program inserted in the transport stream shown in FIG. 21(a) are extracted as shown in FIG. 21(c).

FIG. 21(d) shows the master timing signal which is output from the timing signal generator 16. This master timing signal is generating in the timing signal generator 16 based on the PCR field detection signal shown in FIG. 21(b).

FIG. 21(e) shows the output of the latch 17. The PCR, which is the output of the PCR extractor 14 shown in FIG. 21(c), is latched in the latch 17 by the master timing signal shown in FIG. 21(d), and its output changes as shown in FIG. 21(e) and is applied to the subtractor 21.

FIG. 21(f) shows the output of the AND gate 181. This signal shows whether a program has been switched or the power source has been turned ON or a time base has been switched at the time (A) when a low level pulse is generated, and the signal is supplied to the load control signal generator 182.

FIG. 21(g) shows the load timing signal which is output from the timing signal generator 16. This load timing signal is applied to the load control signal generator 182 together with the output signal of the AND gate 181 shown in FIG. 21(f) and the master timing signal shown in FIG. 21(d).

FIG. 21(h) shows the load control signal generated in the load control signal generator 182. That is, the load control signal generator 182 outputs the load control signal which changes to a low level pulse in the duration T0 until the time (C) when a subtraction of the first PCR and the count is performed immediately after a program switching, a time base switching or the power ON.

FIG. 21(i) shows the output of the counter 19. That is, the counter 19 loads the PCR which is output from the PCR extractor 14 when the load control signal is at the low level. In FIG. 21, P1 which is the value of the PCR output from the PCR extractor 14, is loaded on the counter 19 at the time (B) immediately after the load control signal generates a low level pulse and is applied to the latch 20 as the output of the counter 19 as shown in FIG. 21(i).

FIG. 21(j) shows the output signal of the latch 20. That is, the output of the counter 19 shown in FIG. (1) is applied to the latch 20 and latched by the master timing signal (see FIG. 21(d)) and an output shown in FIG. 21(j) is obtained and applied to the subtractor 21.

FIG. 21(k) shows the output of the subtractor 21. That is, in the subtractor 21, a difference between the PCR output from the latch 17 shown in FIG. 21(e) and the count of the counter 19 output from the latch 20 shown in FIG. 21(j) is calculated and then applied to the low pass filter 22.

As to an output of the subtractor 21, as the period T1 is immediately after a PCR has been loaded on the counter 19 and both the outputs of the latches 17 and 20 are P1, a value of the period T1 becomes 0. After the period T2, since there are deviations between the transmitted and received system clock frequencies and phases, the differences do not always become 0.

If the output ΔK2 of the subtractor 21 in the period T2 is a positive value, the output of the subtractor 21 is controlled such that the frequency of the system clock output from the VCXO is increased. Further, in the period T3, a difference ΔK3 between the PCR P3 and the output S3 of the counter 19 is controlled such that it becomes smaller than the ΔK3. As such operations are repeated, the output of the subtractor 21 becomes 0. That is, when the output of the subtractor 21 becomes 0, the transmitted and received system clock frequencies and phases are synchronized each other.

However, in a conventional PLL circuit with the arrangement as described above, a relatively long time is required until the frequency and the phase of the system clock are locked at the receiver from immediately after a program switching, a time base switching or power ON.

Further, since PCRs are not inserted in a transport stream at equal spaces, a duration for obtaining a difference between the PCR and the count is not constant. So, a factor of the PCR insertion interval is involved in a difference which controls the VCXO and a difference between the PCR and the output of the counter does not depend on only a deviation between frequencies and phases of transmitted and received system clocks.

As described above, since the PCR insertion intervals are not reflected in a frequency control of the system clock, a conventional PLL circuit has such a problem in that the system clock frequency is not precisely controlled for the VCXO.

As described above, in a conventional PLL circuit, once the PCRs are loaded on a counter immediately after a program switching, a time base switching or power ON and after matching a PCR with a counter output, the frequency and the phase of the system clock are locked at the receiver. Therefore, it has such a problem in that a certain length of time is required until the frequency and the phase of the system clock are locked.

Furthermore, there is also such a problem in that the system clock frequency is not accurately controlled since the PCR insertion intervals are not reflected in the control of the system clock frequency.

SUMMARY OF THE INVENTION

It is, therefore, an object of the present invention to provide a PLL circuit and method capable of reducing the time required to lock the frequency and the phase of the system clock at the receiver and accurately controlling the system clock frequency.

In order to achieve the above object, a PLL circuit or method for use in a digital broadcasting receiver according to one aspect of the present invention includes: means for or step of receiving a bit stream transmitted from a broadcast station, the bit stream containing a time-signal and a phase-signal; an oscillator for or step of generating system clocks; a counter for or step of operating in response to the system clocks from the oscillator; means for applying the bit stream from the receiving means to the oscillator, means for or step of controlling the counter so that the counter output matches with the time-signal and the phase-signal, based on differences between both the time-signal and the phase-signal through the applying means and the counter output; and load control means for or step of successively loading twice the time-signal and the phase-signal on the counter in the transmission order of the signals, in the course for locking the frequency and the phase of the system clock provided from the oscillator.

A second aspect of the PLL circuit or method for use in a digital broadcasting receiver according to the present invention includes; means for or step of receiving a bit stream transmitted from a broadcast station, the bit stream containing a time-signal and a phase-signal; an oscillator for or step of generating system clocks; a first counter for or step of operating in response to the system clocks from the oscillator; means for or step of applying the bit stream from the receiving means to the oscillator; means for or step of controlling the first counter so that the counter output matches with the time-signal and the phase-signal, based on differences between both the time-signal and the phase-signal through the applying means and the counter output; and means for or step of compensating a difference between the time-signal and the phase-signal in the bit stream and the output of the first counter according to insertion intervals of the time-signal and the phase-signal in the bit stream.

In the arrangement of the first aspect of the present invention, for instance, immediately after a program switching, a time base switching or power ON, the PCRs (the time-signals and the phase-signals inserted in a bit stream) are once loaded on a counter and a difference between a PCR and a counter output is calculated. Then, a difference between a PCR and a counter output is calculated at the timing when the PCR has been transmitted, and then the PCR is loaded on the counter. Thus, it becomes possible to reduce a time required to lock the frequency and the phase of the system clock at the receiver.

In the arrangement of the second aspect of the present invention, a difference between the PCR and the counter output is normalized by compensating it in accordance with the insertion intervals of the PCRs. This normalization denotes that a difference between a PCR and a counter output does not depend on the PCR insertion interval. Thus, it becomes possible to accurately control the VCXO which outputs the system clocks.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIGS. 21(a)–21(k) is a timing chart for explaining the operation of the PLL circuit shown in FIG. 19.

DESCRIPTION OF THE PREFERRED EMBODIMENTS

Hereinafter, preferred embodiments according to the present invention will be described in detail referring to FIGS. 1 through 18.

Figure 1:
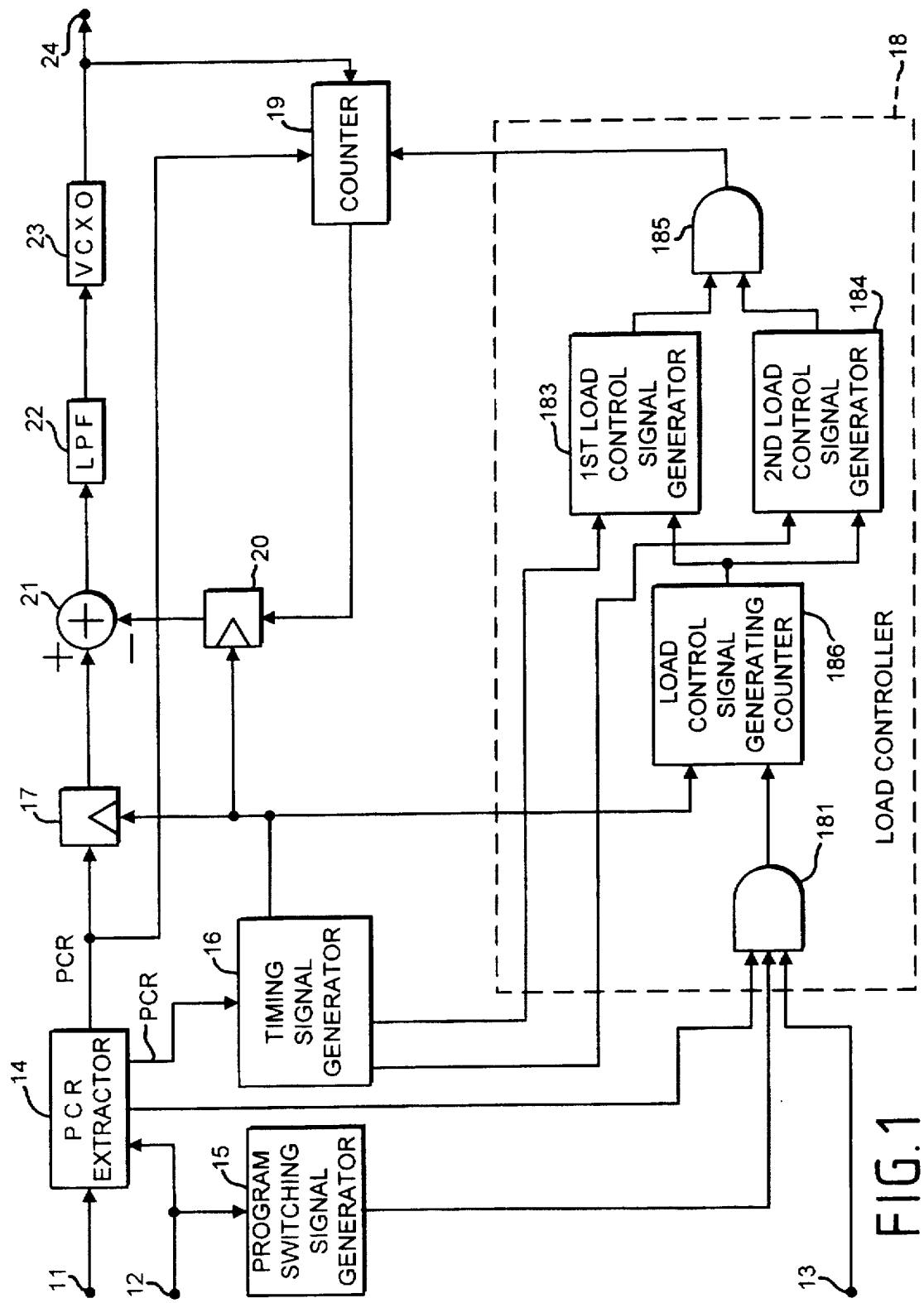
FIG. 1 is a block diagram showing a first embodiment of a PLL circuit according to the present invention.
Figure 19:
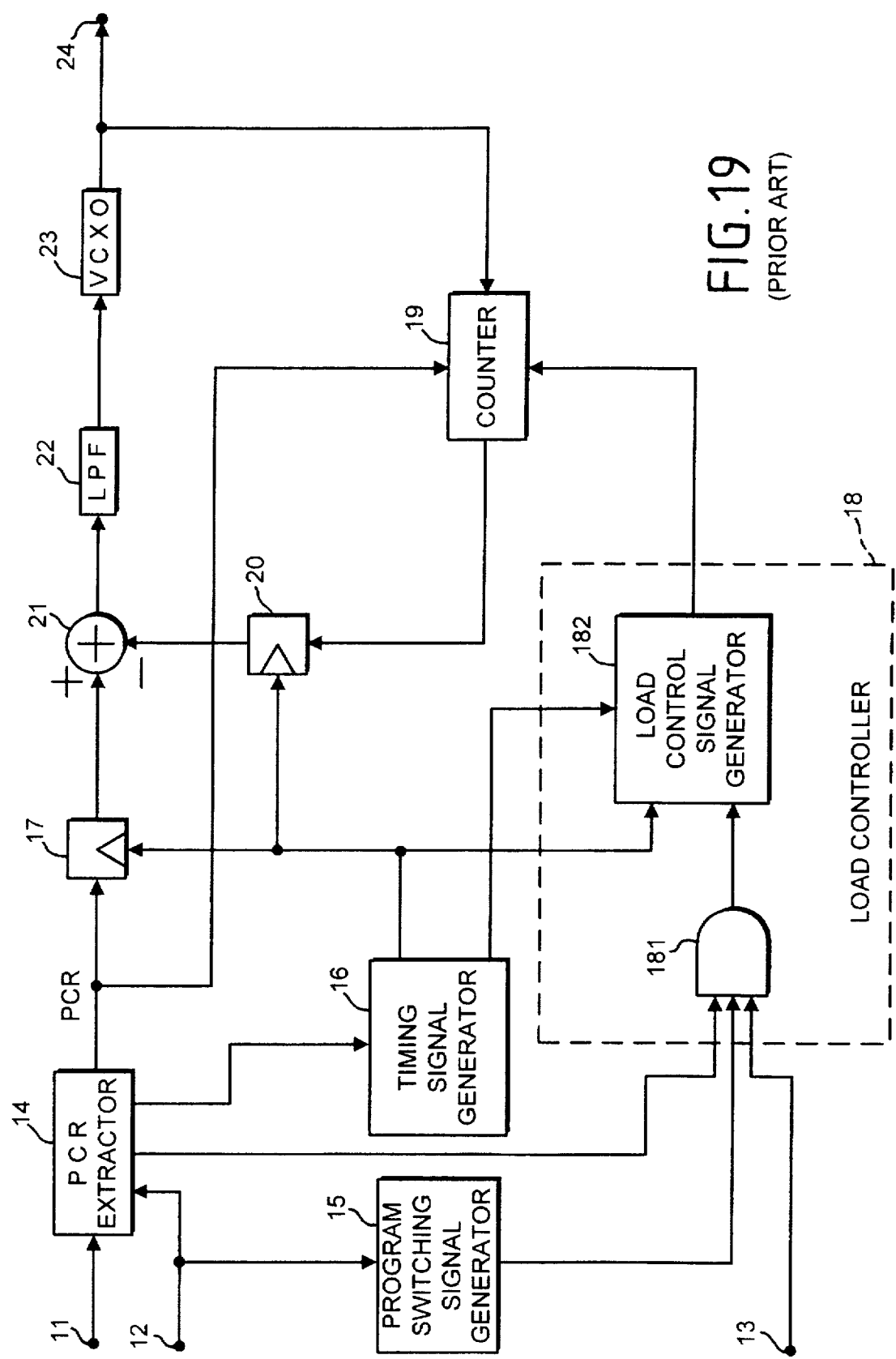
FIG. 19 is a block diagram showing the PLL circuit which is used in a receiver of a conventional MPEG2 system.

FIG. 1 shows a first embodiment of the PLL circuit according to the present invention. In FIG. 1, the same reference numerals are assigned to the same parts as in FIG. 19 and only elements differing from those shown in FIG. 19 will be described here.

In this embodiment, a time required for locking the frequency and the phase of the system clocks at the receiver, which has been a problem in a conventional example, has been improved by loading the PCRs on the counter continuously twice.

This embodiment features the arrangement of the load controller 18. That is, this load controller 18 is provided with a load control signal generating counter 186, a first load control signal generator 183, a second load control signal generator 184 and an AND gate 185 in addition to the AND gate 181 which has been described above.

Further, in the timing signal generator 16, a master timing signal is generated from the PCR field detection signal and also, a first and a second load timing signals are generated and applied to the load control signal generators 183 and 184, respectively.

In the load controller 18, the AND gate 181 receives as inputs a time base switching signal which is output from the PCR extractor 14 and a power ON reset signal which is output from the terminal 13 and performs an AND operation. The result of this AND operation is applied to a load control signal generating counter 186.

The load control signal generating counter 186 operates using the master timing signal output from the timing signal generator 16 as a clock input and the output signal of the AND gate 181 as a reset signal. The output of the load control signal generating counter 186 is applied to the first and the second load control signal generators 183 and 184, respectively.

The first load control signal generator 183 generates a first load control signal from the output of the load control signal generating counter 186 and the first load timing signal output from the timing signal generator 16. Further, the second load control signal generator 184 generates a second load control signal from the output of the load control signal generating counter 186 and the second load timing signal output from the timing signal generator 16.

The first and the second load control signals are applied to the AND gate 185, where an AND logic of both signals is operated, and the result is applied to the counter 19 as a load control signal.

In the arrangement described above, its operation will be described referring to FIG. 2.

Figure 2:
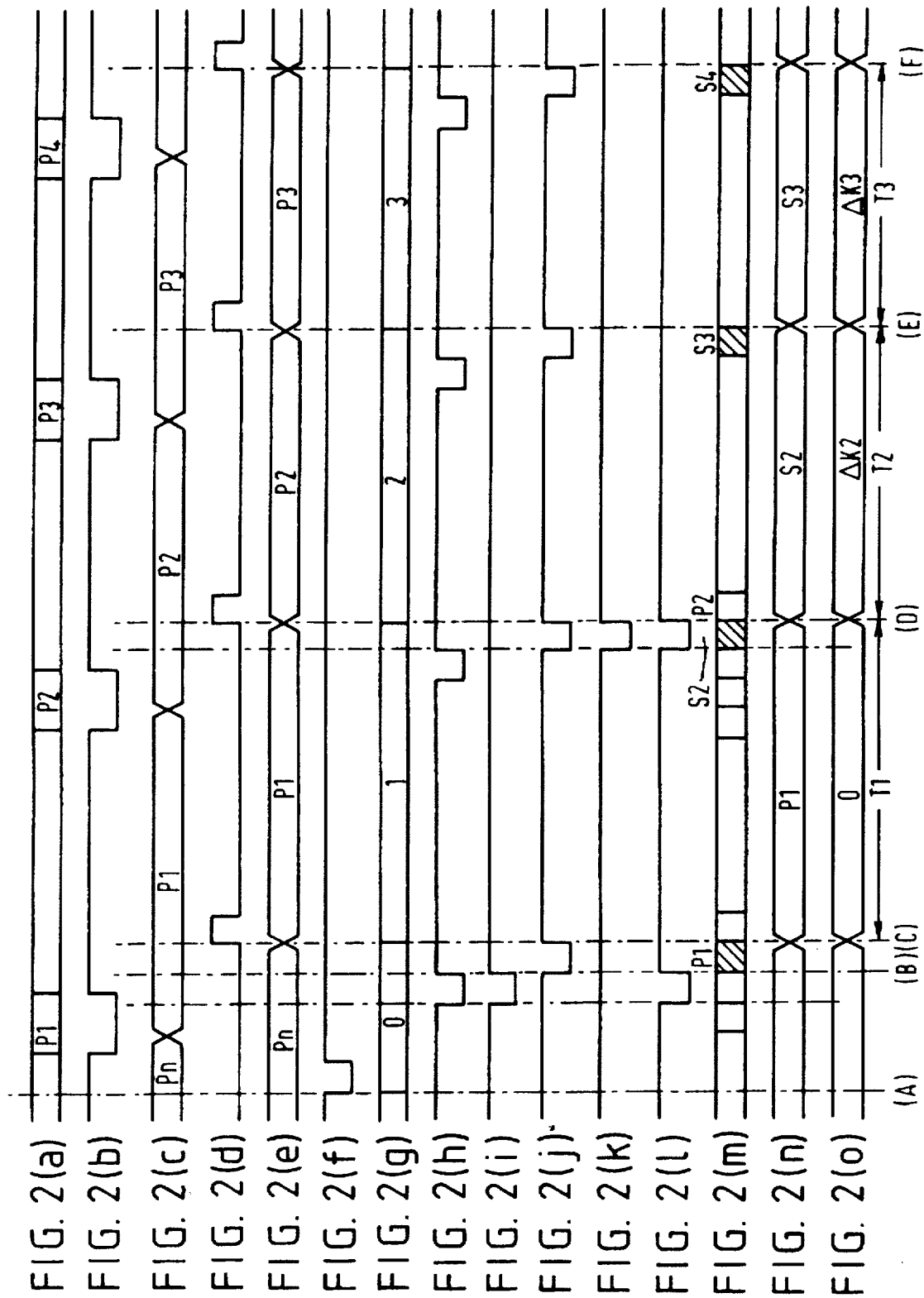
FIGS. 2(a)–2(o) is a timing chart for explaining the operation of the first embodiment.

FIG. 2 shows output timings of major parts and FIG. 2(a) shows a transport stream which is input through the terminal 11. In this transport stream, the PCRs of a user-selected program have been inserted at the locations P1, P2, P3 and P4.

This transport stream is applied to the PCR extractor 14, wherein the PCR field detection signal shown in FIG. 2(b) is generated. This PCR field detection signal in synchronism with the transport stream shows locations where the PCRs are inserted and at the low level in the duration when the PCRs are inserted, that is, in the durations of P1, P2, P3 and P4 of the transport stream shown in FIG. 2(a). This PCR field detection signal is applied to the timing signal generator 16.

Further, in the PCR extractor 14, P1, P2, P3 and P4 which are the PCRs of a user-selected program inserted in the transport stream shown in FIG. 2(a) have been extracted as shown in FIG. 2(c). The extracted PCRs are applied to the latch 17 and the counter 19.

In the timing signal generator 16, the master timing signal shown in FIG. 2(d) is generated based on the PCR field detection signal shown in FIG. 2(b). Further, in the latching circuit 17, the PCRs extracted by the PCR extractor 14 shown in FIG. 2(c) are latched by the master timing signal shown in FIG. 2(d) as shown in FIG. 2(a). The latched outputs are applied to the subtractor 21.

Here, assuming that the output signal of the AND gate 181 generates a low level pulse at the timing (A) shown in FIG. 2(f) in the load controller 18, this pulse shows the program switching, the power source ON or a time base switching and is applied to the load control signal generating counter 186.

The master timing signal output from the timing signal generates 16 is applied to the load control signal generating counter 186 as the master timing signal and the output signal of the AND gate 181 is input as the reset signal. That is, this counter 186 is reset when the output signal of the AND gate 181 drops to the low level. Thereafter, if the reset is canceled, the counter 186 sequentially counts up at every leading edge of the master timing signal which has been input as a clock input. So, the outputs of the load control signal generating counter 186 will be as shown in FIG. 2(g). The outputs of this counter 186 are applied to the first and the second load control signal generators 183 and 184.

The first load timing signal shown in FIG. 2(h) and the output signal of the load control signal generating counter 186 shown in FIG. 2(g) are applied to the first load control signal generator 182.

The first load timing signal shown in FIG. 2(h) is generated in the timing signal generator 16 based on the PCR field detection signal shown in FIG. 2(b) and its load timing is such that the PCRs are loaded on the counter 19 in the duration at the low level. The first load control signal generator 183 outputs a signal shown in FIG. 2(i). Only when the output signal of the load control signal generating counter 186 is 0, this signal passes through the first load timing signal and is at the high level in the period when the output of the load control signal generating counter 186 has a different value.

Further, the second load timing signal shown in FIG. 2(j) and the output signal of the load control signal generating counter 186 shown in FIG. 2(g) are input to the second load control signal generator.

The second load timing signal shown in FIG. 2(j) is generated in the timing signal generator 16 based on the PCR field detection signal, and its load timing is such that the PCRs are loaded on the counter 19 in the duration at the low level state.

The second load control signal generator 184 outputs the signal shown in FIG. 2(k). Only when the output signal of the load control signal generating counter 186 is 1, this signal passes through the second load timing signal and stays at the high level in the duration when the output of the load control signal generating counter has a different value.

The first load control signal shown in FIG. 2(i) and the second load control signal shown in FIG. 2(k) are applied to the AND gate 105 and the load control signal shown in FIG. 2(l) is obtained from the AND operation. This load control signal controls the loading operation to the counter 19, and the loading operation to the counter 19 is allowed when this load control signal is at the low level.

In the example shown in FIG. 2, the load control signal is at the low level immediately before the times (B) and (D). On the other hand, the output of the PCR extractor 14 shown in FIG. 2(c) during this period has the value P1 at the time (B) and P2 at the time (D) and these values are loaded on the counter 19.

P1 and P2 values loaded on the counter 19 are output immediately after the times (B) and (D) as the outputs of the counter 19 as shown in FIG. 2(m). That is, after outputting the PCR P1 loaded immediately after the time (B), the counter 19 counts in order until S2 is output immediately before the time (D) and outputs the PCR P2 loaded again immediately after the time (D). Thereafter, count-up operation continues in the order.

The output of the counter 19 shown in FIG. 2(m) is latched by the master timing signal (see FIG. 2(d)) in the latch 20, turned to a signal shown in FIG. 2(n), and applied to the subtractor 21.

In the subtractor 21, a difference between the output of the latch 17 shown in FIG. 2(e) and the output of the latch 20 shown in FIG. 2(n) is calculated. In the period T1, since it is immediately after the PCRs have been loaded on the counter 19, both the output of the latch 17 (see FIG. 2(e)) and the output of the latch 20 (see FIG. 2(n)) have the same P1. Thus, the output of the subtractor 21 becomes 0 as shown in FIG. 2(o).

Thereafter, the output 0 of the subtractor 21 passes through the low-pass filter 22 to control the VCXO 23. In the period T1, the VCXO 23 outputs a system clock having frequency f1 corresponding to a value obtained by passing the output 0 of the subtractor 21 through the low-pass filter 22.

Here, assuming that the system clock frequency at the transmitter is fM, as the counter 19 runs under a control of the system clock having the frequency f1 in the period T1, a difference equivalent to a difference between transmitted and received system clock frequencies fM and f1 is produced between the output S2 of the counter 19 and the PCR P2 immediately before the time (D) and the output of the subtractor 21 will become ΔK2.

Here, if the duration of the period T1 is presented by t1, P2, S2 and ΔK2 may be expressed by the equation (1—1), (1-2) and (1-3) as shown below.

$$P2 = fM \times t1 + P1 \quad (1\text{—}1)$$

$$S2 = f1 \times t1 + P1 \quad (1\text{-}2)$$

$$\begin{aligned} \Delta K2 &= P2 - S2 \\ &= (fM \times t1 + P1) - (f1 \times t1 + P1) \\ &= (fM - f1) \times t1 \end{aligned} \quad (1\text{-}3)$$

Therefore, since ΔK2 is a value resulting from a difference between the transmitted and received system clock frequencies, if the VCXO 23 is controlled by ΔK2 after passing through the low-pass filter 22, it is possible to make the system clock frequency obtained from the VCXO 23 to a value close to the system clock frequency fM at the transmitter.

Thereafter, when the PCR P2 is loaded on the counter 19 immediately after the time (D), a time lag between the transmission and the reception can be eliminated. So, the transmitted and received system clock frequencies and phases are values extremely close to each other at the time immediately after the time (D). Thereafter, the time required for locking the received frequency and the phase of the system clock is reduced.

Therefore, according to the embodiment as described above, when the PCRs are loaded on the counter twice continuously, it becomes possible to match frequencies and phases of transmitted and received system clocks nearly in agreement with each other at the second loading operation, and it is possible to reduce the time required for looking the frequency and the phase of the system clock at the receiver.

Figure 3:
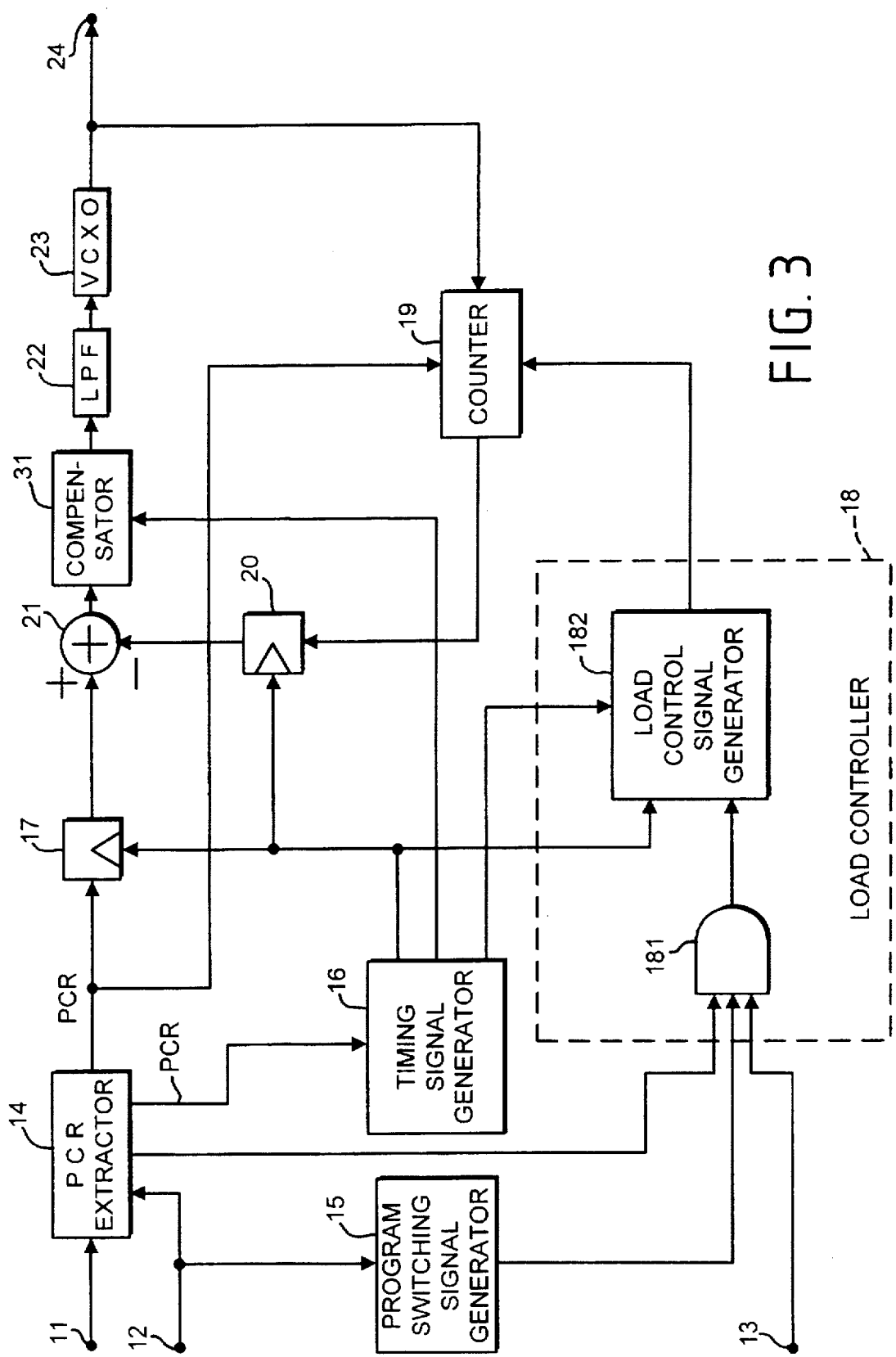
FIG. 3 is a block diagram showing a second embodiment of the PLL circuit according to the present invention.

FIG. 3 shows a second embodiment of the PLL circuit according to the present invention. In FIG. 3, the same reference numerals are assigned to the same elements as in FIG. 19 and elements differing from those shown in FIG. 19 will be explained here.

In this embodiment, a conventional PLL circuit has been improved by adding a compensator 31 so that the difference between the PCR and the count of the counter 19 is normalized and the VCXO 23 is accurately controlled.

That is, a difference between the PCR output from the PCR extractor 14 and the count of the counter 19 is applied to the compensator 31. This compensator 31 normalizes the difference output from the subtractor 21 by compensating it to reflect the PCR insertion interval according to a compensation timing signal output from the timing signal generator 16.

Further, the timing signal generator 16 generates a compensation timing signal by producing pulses at the locations of a transport stream, wherein the PCRs are inserted.

Figure 4:
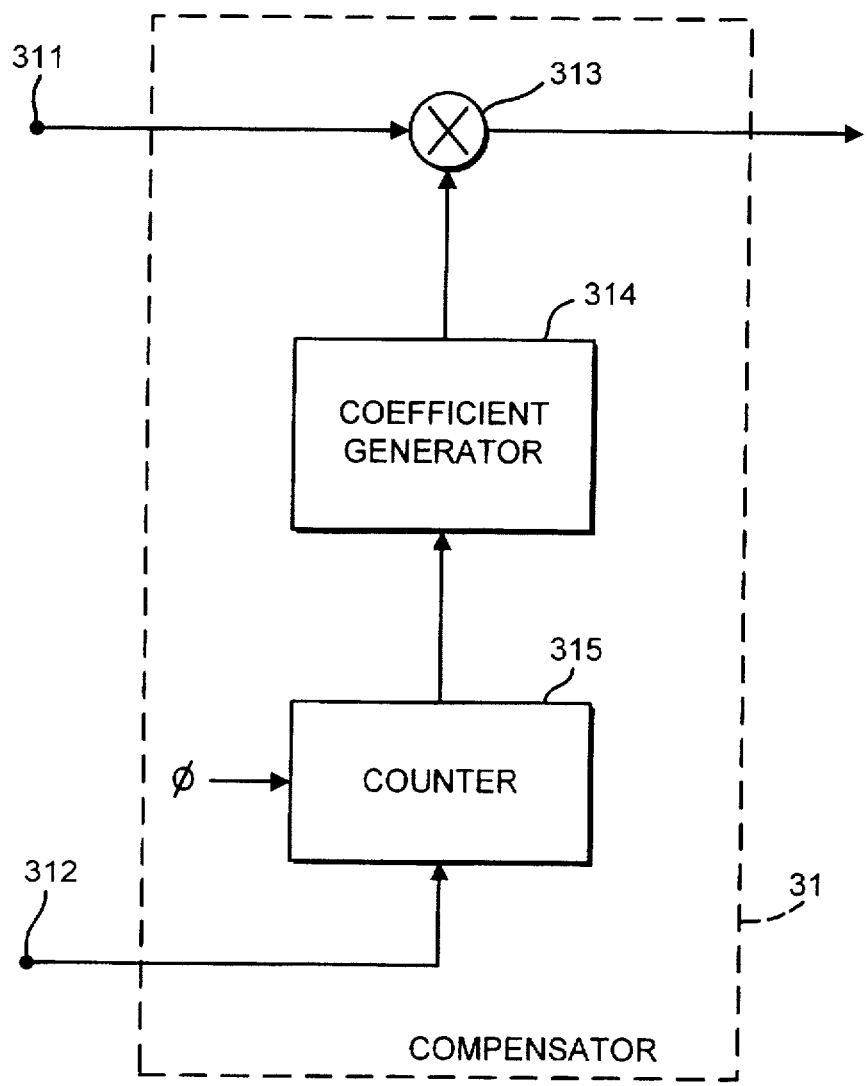
FIG. 4 is a block diagram showing the compensator which is used in the second embodiment.
Figure 5:
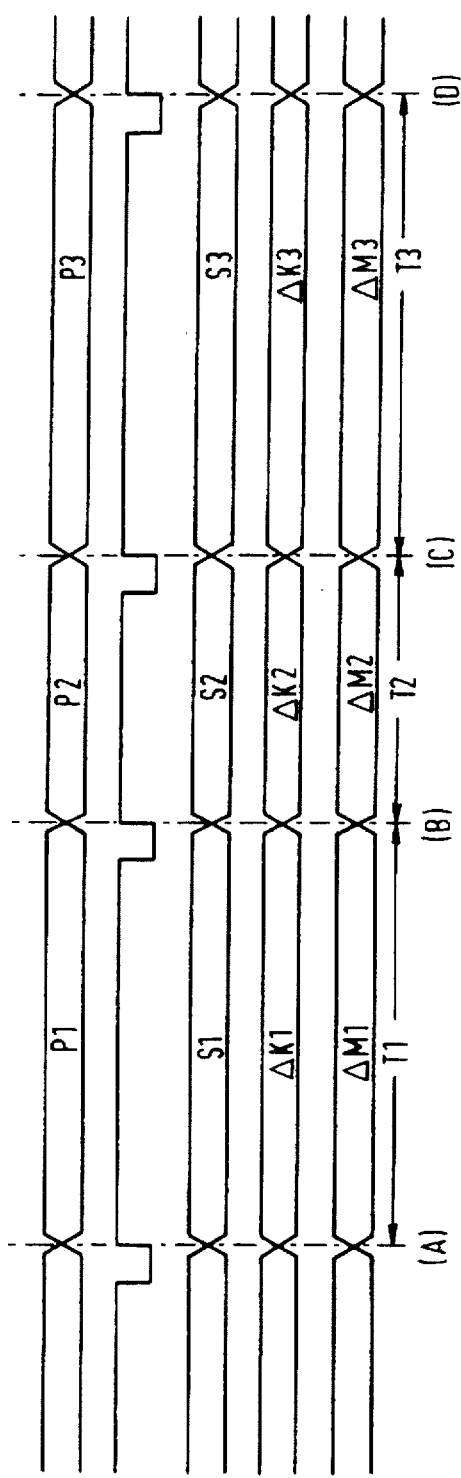
FIGS. 5(a)–5(e) is a timing chart for explaining the operation of the compensator shown in FIG. 4.

The specific arrangement of the compensator 31 is shown in FIG. 4. In FIG. 4, 311 is a terminal to which a difference output from the subtractor 21 is input, 312 is a terminal to which the compensation timing signal output from the timing signal generator 16 is input. The compensator 31 is comprised of a multiplier 313, a coefficient generator 314 and a counter 315.

In the arrangement described above, the operation to normalize the output of the subtractor 21, which is a difference between the PCR and the count of the counter 19, is shown in a timing chart in FIG. 3. FIG. 5(a) shows the output of the latch 17. FIG. 5(b) shows the compensation timing signal. FIG. 5(c) shows the output of the latch 20. FIG. 5(d) shows the output of the subtractor 21. FIG. 5(e) shows the output of the compensator 31. The operation of the compensator 31 shown in FIG. 4 is described referring to FIGS. 5(a) through 5(e) in the following.

The compensation timing signal which is applied to the terminal 312 from the timing signal generator 16 changes to the reset signal of the counter 315. This counter 315 counts the period until it is reset according to a clock ϕ and the output result is applied to the coefficient generator 314.

Here, the clock is a clock which is used when transmitting a transport stream. By continuing the number of counts in a period until the counter 315 is reset, it is possible to measure the insertion intervals of the PCRs.

That is, in the period T2 described above, the PCR takes the value of P2 immediately before the time (B), while the counter 315 takes the count S2. A difference between the P2 and the S2 is presented by ΔK2. Factors involved in generating the differences ΔK2 include a duration t1 of the period T1 and the fact that transmitted and received system clock frequencies are different in the period T1. If the transmitted system clock frequency is presented by fM, while the received system clock frequency in the period T1 is presented by f1, a following equation is established.

$$\Delta K2 = (fM - f1) \times t1 \quad (2\text{-}1)$$

Hereafter, on the counter 315, when calculating the duration t1 of the period T1 by measuring an interval of low level pulses of the compensation timing signal shown in FIG. 5(b) and multiplying the difference ΔK2 between P2 and the S2 with the reciprocal of the t1 as shown by equation (2-2), it is possible to obtain a normalized difference ΔM2 which is not governed by the PCR insertion interval.

$$\begin{aligned} \Delta M2 &= \Delta K2 \times (1/t1)\} \\ &= (fM - f1) \times t1 + \{1/t1\} \\ &= fM - f1 \end{aligned} \quad (2\text{-}2)$$

That is, the output of the subtractor 21 depends on the PCR insertion interval. However, as shown in the equation (2-2), when it is multiplied by the reciprocal of the PCR insertion interval by the multiplier 313, the factor of the PCR insertion interval is canceled and it takes a value which does not depend on the PCR insertion interval.

Therefore, according to the arrangement of the PLL circuit in the embodiment described above, it is possible to normalize the output of the subtractor 21, which is a difference between PCR and the output of the counter 19 in the compensator 31. This normalized difference passes through the low-pass filter 22 and is able to control the VCXO 23 accurately as it is not governed by the PCR insertion interval.

Figure 6:
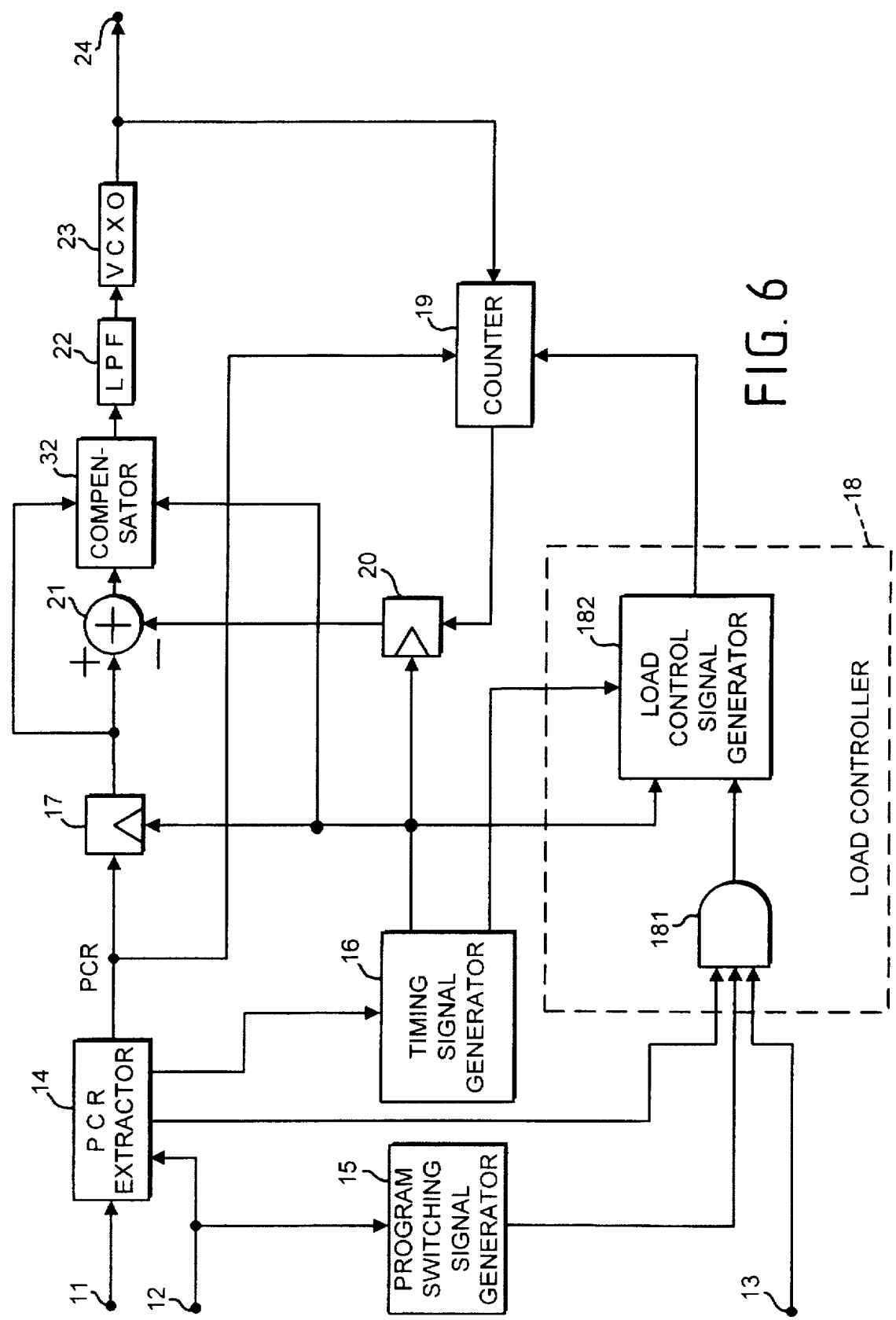
FIG. 6 is a block diagram showing a third embodiment of the PLL circuit according to the present invention.

FIG. 6 shows the arrangement of the PLL circuit involved in the third embodiment according to the present invention. However, in FIG. 6 the same reference numerals are assigned to the same elements as those in FIG. 19 and elements differing from those shown in FIG. 19 will be described here.

In this embodiment, a conventional PLL circuit has been improved by adding a compensator 32 to normalize a difference between the PCR and the count and accurately control the VCXO 23, and the arrangement of the compensator 31 used in the second embodiment has been changed but the basic operation is the same as that of the second embodiment.

That is, the PCR extracted from the PCR extractor 14 is latched by the master timing signal in the latch 17 and applied to the subtractor 21 and the compensator 32.

In the subtractor 21, the count output from the latch 20 is subtracted from the PCR output from the latch 17. The difference between the PCR and the count output from the subtractor 21 is applied to the compensator 32. The compensator 32 normalizes the difference by compensating it to reflect the PCR insertion interval.

Figure 7:
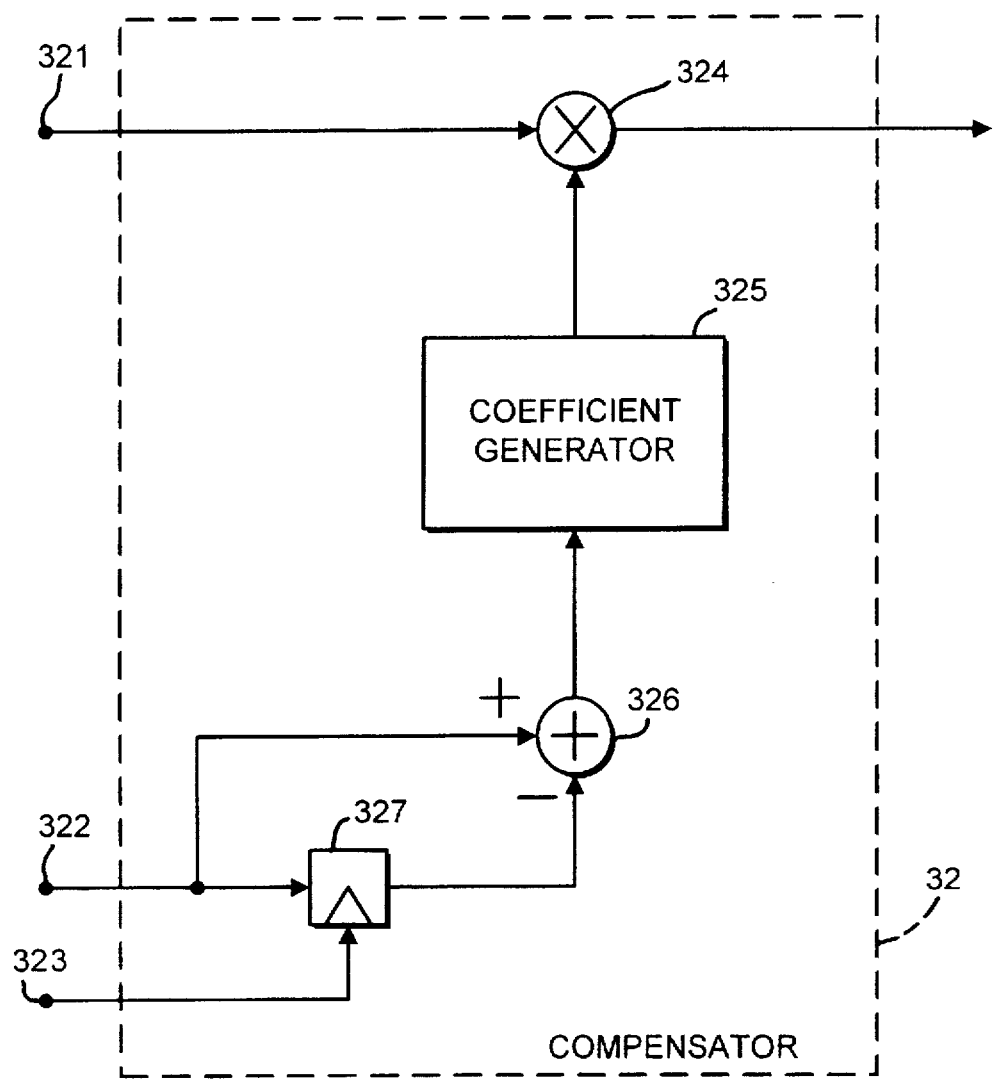
FIG. 7 is a block diagram showing the compensator which is used in the third embodiment.
Figure 8:
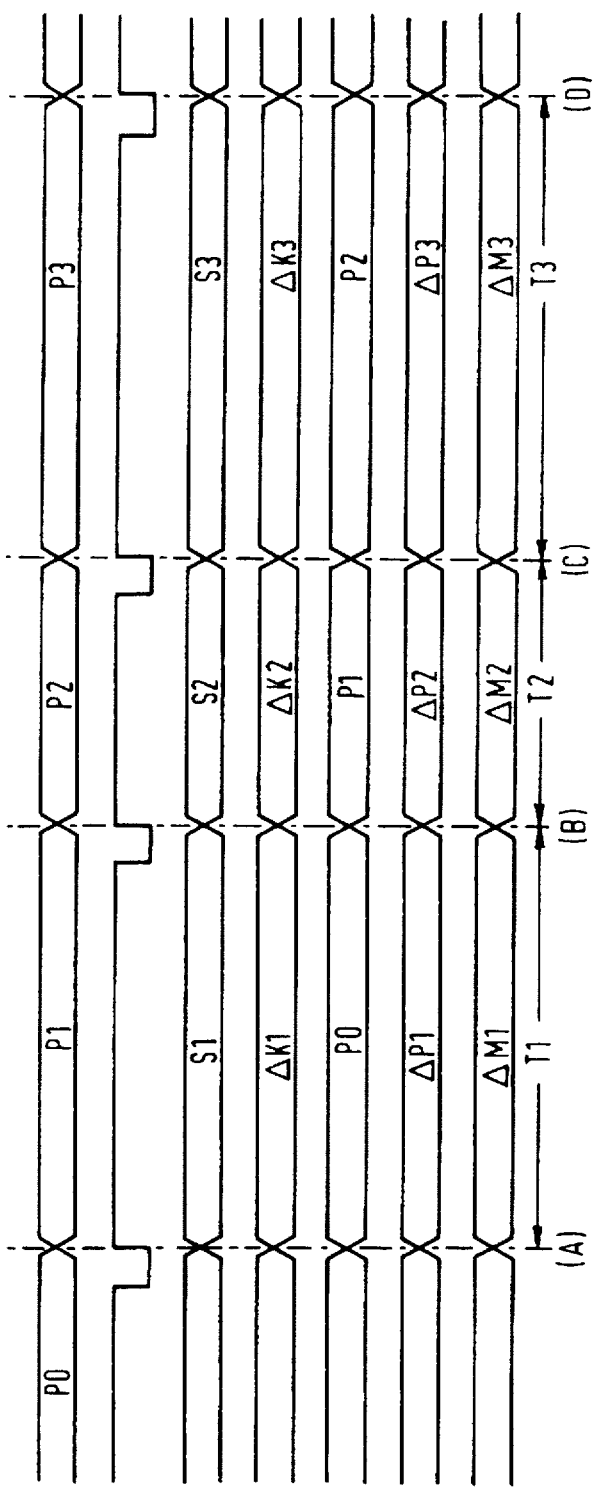
FIGS. 8(a)–8(g) is a timing chart for explaining the operation of the compensator shown in FIG. 7.

The compensator 32 is comprised of a multiplier 324, a coefficient generator 325, a subtractor 326, and a latch 327 as shown in FIG. 7. FIG. 8 shows a timing chart explaining the operation to normalize the output of the subtractor 21, which is the difference between the PCR and the count. Hereafter, the operation of the compensator 32 shown in FIG. 7 will be explained using the timing chart shown in FIG. 8.

The PCR, which is output from the latch 17, is applied to the terminal 322. This PCR is applied to the subtractor 326 and the latch 327. This output of the latch 17 is shown in FIG. 8(m). In the latch 327, the PCR which is the output of the latch 17 is latched according to the master timing signal (see FIG. 8(b)) input from the terminal 323 and applied to the subtractor 326. The output signal of the latch 327 is shown in FIG. 8(e).

In the subtractor 326, a difference between the output signal of the latch 17 (FIG. 8(a), which is input through the terminal 322, and the output of the latch 327 (see FIG. 8(e)) is calculated. The output signal of the subtractor 326 (see FIG. 8(f)) is a difference between PCRs which are transmitted adjacently and a value showing the insertion interval of PCRs.

In FIG. 8, the value P1 of the PCR, which is output from the latch 17, shows the PCR at the time (A). Similarly, the values P2 and P3 show the PCRs at the times (B) and (C), respectively. Assuming that durations of the periods T1, T2 and T3 are t1, t2 and t3, the output signal P2 of the subtractor 326 will be given by the following equation:

$$P2 = P2 - P1 \quad (3\text{-}1)$$
$$= fM \times t1$$

Here, the system clock frequency with PCR is fM at the transmitter. So, the output signal P3 of the subtractor 326 will be given by the following equation:

$$P3 = P3 - P2 \quad (3\text{-}2)$$
$$= fM \times t2$$

As described above, the output of the subtractor 326 is a signal depending on the PCR insertion interval. The reciprocal of this output of the subtractor 326, which is dependent on the PCR insertion interval, is calculated in the coefficient generator 325 and multiplied to the output signal of the subtractor 21 (see FIG. 8(d)), which is a difference between a PCR input through the terminal 321 and a count of the counter 19 (the output of the latch 20 (see FIG. 8(c)) in the multiplier 324.

Here, in the period T2 a PCR immediately before the time (B) has the value P2 while the output of the counter 19 has the value S2. The difference between the P2 and the S2 takes a value of ΔK2. The duration t1 of the period T1 gives a factor for causing the difference ΔK2, in addition to a factor causing the difference in frequencies in the transmitted and received system clocks.

When transmitter system clock frequency is presented by fM, while the receiver system clock frequency is presented by f1, the difference ΔK2 is given by the following equation (3-3).

$$\Delta K2 = (fM - f1) \times t1 \quad (3\text{-}3)$$

Hereafter, when a duration t1 of the period T1 is calculated from the output ΔP2 of the subtractor 326 inside the compensator 32 (ΔP2=fM×t1; see equation (3-1)) and a difference ΔK2 between P2 and S2 is multiplied with the reciprocal of ΔP2 as shown in equation (3-4), it is possible to obtain a normalized difference ΔM2 which is not governed by a PCR insertion interval.

$$\begin{aligned}\Delta M2 &= \Delta K2 \times (1/\Delta P2) \quad (3\text{-}4)\\ &= (fM - f1) \times t1 \times (1/fM \times t1)\\ &= (fM - f1) \times (1/fM)\end{aligned}$$

From equations (3-4), when ΔK2 which depends on the PCR insertion interval is multiplied with the reciprocal of t1, which is a PCR insertion interval, a factor of a PCR insertion interval is canceled. Thus ΔM2, which is the output signal of the compensator 32, is normalized to a value which does not depend on the PCR insertion interval. FIG. 8(g) shows the output of the compensator 32.

Therefore, according to the arrangement of the embodiment described above, it is possible to normalize the output of the subtractor 21, which is a difference between the PCR and the output of the counter 19 in the compensator 32. Since the normalized difference output from the compensator 32 is not governed by the PCR insertion interval, it is possible to pass through the low-pass filter 22 and accurately control the VCXO 23.

Figure 9:
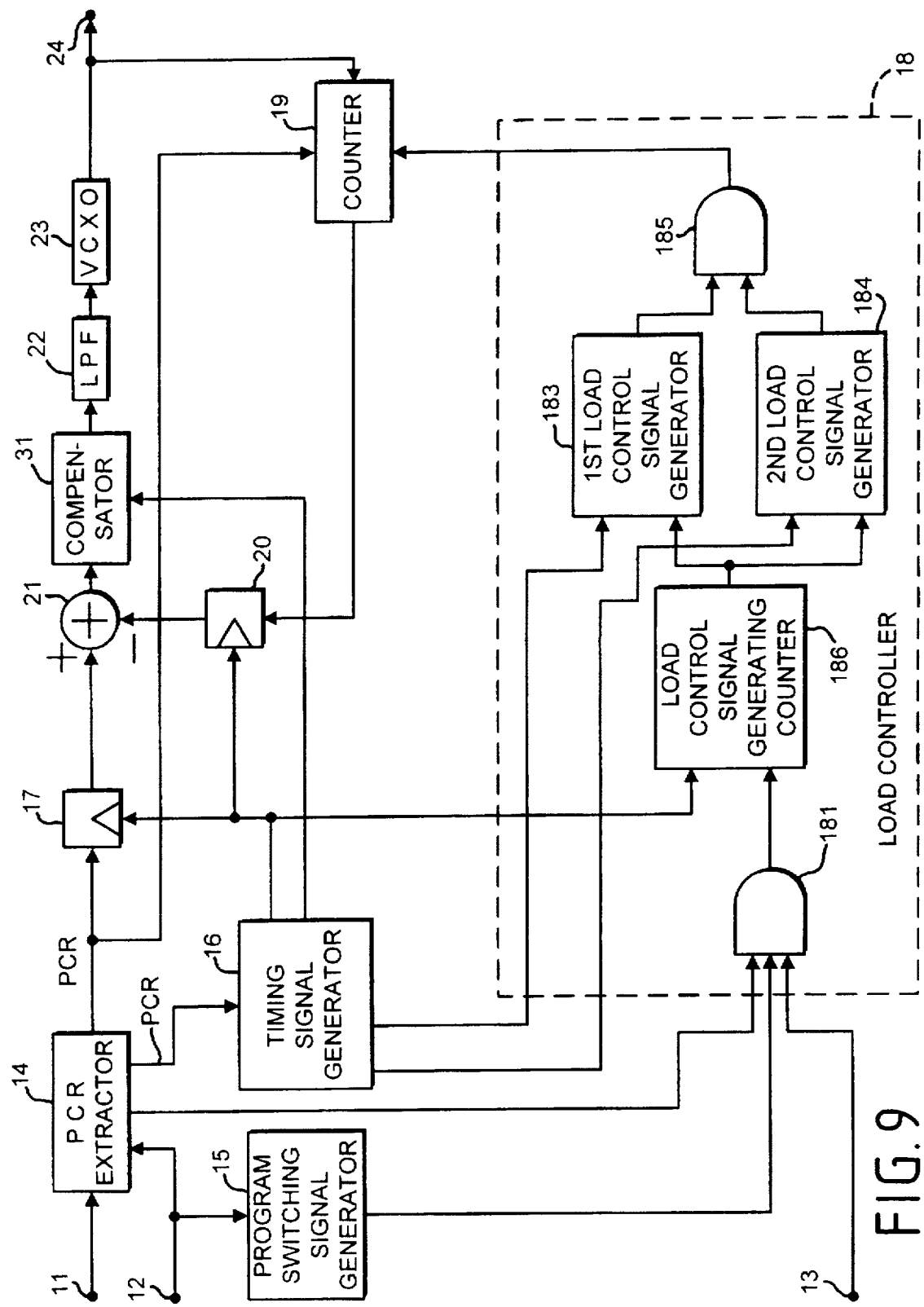
FIG. 9 is a block diagram showing a fourth embodiment of the PLL circuit according to the present invention.

FIG. 9 shows the arrangement of the PLL circuit involved in the fourth embodiment according to the present invention. In FIG. 9, the same reference numerals are assigned to the same elements as those in FIGS. 1 and 3, and different elements will be explained here.

This embodiment is a combination of the first and the second embodiments. That is, first and second load control signal generators 183, 184, an AND gate 185 and a load control signal generating counter 186 have been added to the load controller 18 as means for loading PCRs continuously twice. Further, the compensator 31 has been inserted between the subtractor 21 and the LPF 22 as a means for compensating and normalizing the difference between the PCR and the counter output.

Further, first and second load timing signals for the first and the second load control signal generators 183, 184 and a compensation timing signal for the compensator 31 are generated in the timing signal generator 16.

The operation of the PLL circuit with the arrangement as described above will be explained referring to FIG. 10.

Figure 10:
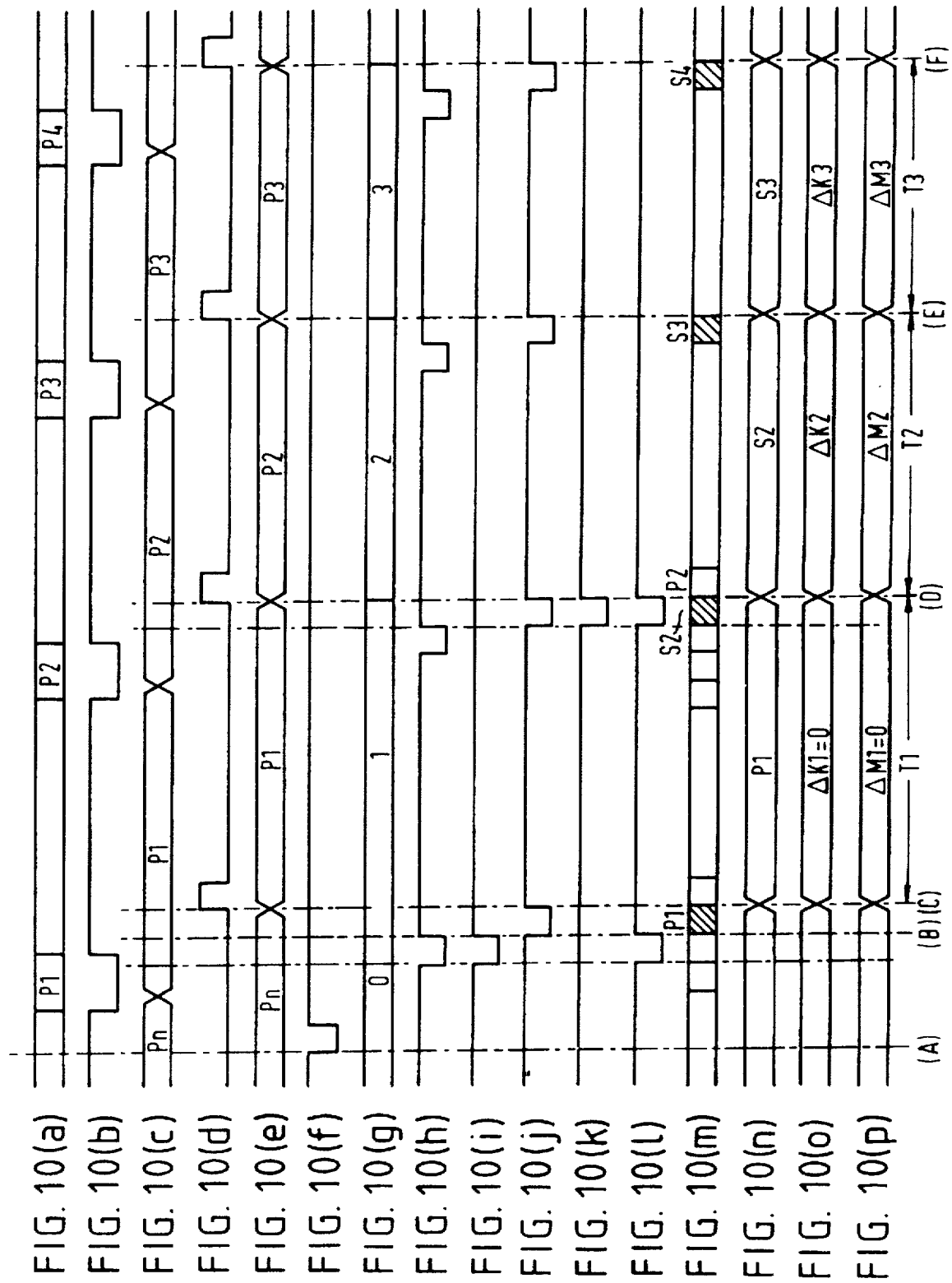
FIGS. 10(a)–10(p) is a timing chart for explaining the operation of the fourth embodiment.

FIG. 10 shows the output timings of principal parts, while FIG. 10(a) shows a transport stream which is input through the terminal 11. User-selected program PCRs have been inserted in this transport stream at the locations P1, P2, P3 and P4.

This transport stream is applied to the PCR extractor 14, wherein the PCR field detection signal shown in FIG. 10(b) is generated. This PCR field detection signal in synchronism with the transport stream shows portions of the transport stream in which PCRs have been inserted. This signal is at the low level in the periods when PCRs have been inserted, that is, the periods of P1, P2, P3 and P4 of the transport stream shown in FIG. 10(a). This PCR field detection signal is applied to the timing signal generator 16.

Further, in the PCR extractor 14, P1, P2, P3 and P4, which are user-selected program PCRs inserted in the transport stream shown in FIG. 10(a), are extracted as shown in FIG. 10(c). The extracted PCRs are applied to the latch 17 and the counter 19.

In the timing signal generator 16, the master timing signal shown in FIG. 10(d) is generated based on the PCR field detection signal shown in FIG. 10(b). Further, in the latch 17, the PCR extracting outputs of the PCR extractor 14 shown in FIG. 10(c) are latched by the master timing signal shown in FIG. 10(d) as shown in FIG. 10(e). The latched outputs are applied to the subtractor 21.

Here, it is assumed that the output signal of the AND gate 181 generates a low-level pulse at the timing (A) shown in FIG. 10(f) in the load controller 18. This pulse shows whether a program has been switched, the power source has been turned ON or a time base has been switched and is applied to the load control signal generating counter 186.

To the load control signal generating counter 186, the master timing signal output from the timing signal generator 16 is input as a clock and the output signal of the AND gate 181 is input as a reset signal. That is, this counter 186 is reset when the output signal of the AND gate 181 drops to the low level. Thereafter, when the reset is canceled, the counter sequentially counts up at every leading edge of the master timing signal which operates as a clock input. So, the output of the load control signal generating counter 186 will change as shown in FIG. 10(g). This output of the counter 186 is applied to the first load control signal generator 183 and the second load control signal generator 184.

To the first load control signal generator 183, the first load timing signal shown in FIG. 10(h) and the output signal of the load control signal generating counter 186 shown in FIG. 10(g) are input.

The first load timing signal shown in FIG. 10(h) is generated based on the PCR field detection signal shown in FIG. 10(b) in the timing signal generator 16 and PCRs are loaded on the counter 19 in the low level period. The first load control signal generator 183 outputs the signal shown in FIG. 10(i). This signal is a signal through the first load timing signal only in the period when the output of the load control signal generating counter 186 is 0 and is at a high level in the period of other values.

Further, the second load timing signal shown in FIG. 10(j) and the output signal of the load control signal generating counter 100 shown in FIG. 10(g) are applied to the second load control signal generator 184.

The second load timing signal shown in FIG. 10(j) is generated based on the PCR field detection signal shown in FIG. 10(b) in the timing signal generator 16 and PCRs are loaded on the counter 19 in the low level period.

The second load control signal generator 184 outputs the signal shown in FIG. 10(k). This signal is a signal through the second load timing signal only in the period when the output signal of the load control signal generating counter 186 is 1 and is at a high level in the period of other values.

The first load control signal shown in FIG. 10(i) and the second load control signal shown in FIG. 10(k) are applied to the AND gate 185, wherein a load control signal shown in FIG. 10(l) is obtained through the AND operation. This load control signal controls the loading operation to the counter 19 and the loading operation to the counter 19 is allowed when this load control signal is at the low level.

In the example of FIG. 10, the load control signal is at the low level immediately before the times (B) and (D). On the other hand, the outputs of the PCR extractor 14 shown in FIG. 10(c) during this period are P1 and P2 at the times (B) and (D), respectively and these values are loaded on the counter 19.

The values of P1 and P2 loaded on the counter 19 are output immediately after the times (B) and (D), respectively as the counts of the counter 19 as shown in FIG. 10(m). That is, after outputting the PCR P1 which has been loaded immediately after the time (B), the counter 19 counts up successively until it outputs S2 immediately before the time (D) and outputs the loaded PCR P2 again immediately after the time (D). Thereafter, the counter 19 counts up successively.

The output of the counter 19 shown in FIG. 10(m) is latched by the master timing signal (see FIG. 10(d)) in the latch 20, changes to the signal shown in FIG. 10(n) and is applied to the subtractor 21 shown in FIG. 10(n).

In this subtractor 21, a difference between the output of the latch 17 shown in FIG. 10(e) and the output of the latch 20 shown in FIG. 10(n) is calculated. In the period T1, since it is immediately after when the PCR has been loaded on the counter 19, the output of the latch 17 (see FIG. 10(e)) and that of the latch 20 (see FIG. 10(n)) are both the same P1 and the output of the subtractor 21 becomes 0 as shown in FIG. 10(o). This is clear from equation (4-1) shown below.

$$\Delta K1 = P1 - P1 = 0 \tag{4-1}$$

Hereafter, even when multiplied with a compensation coefficient in the compensator 31, the output $\Delta K1$ of the subtractor 21 still remains 0. The output of the compensator 31 changes as shown in FIG. 10(p), and thus the compensated output $\Delta M1=0$ passes through the low-pass filter 23 to control the VCXO 23. In the period T1, the VCXO 23 outputs the system clock with the frequency f1 corresponding to the value obtained by passing the output 0 of the compensator 31 through the low-pass filter 22.

Here, the transmitter system clock frequency is presented by fM. In the period T1, as the counter 19 operates at the system clock having the frequency f1, a difference corresponding to the difference of the transmitted system clock frequency fM and the received system clock frequency f1 is produced between the count S2 of the counter 19 and the value P2 of the PCR immediately before the time (D). When the duration of the period T1 is presented by t1, P2 and S2 are expressed by the following equations (4-2) and (4-3):

$$P2 = fM \times t1 + P1 \tag{4-2}$$

$$S2 = f1 \times t1 + P1 \quad (4\text{-}3)$$

Further, the output ΔK2 of the subtractor 21 in the period T1 is expressed by equations (4-4):

$$\begin{aligned} \Delta K2 &= P2 - S2 \quad (4\text{-}4) \\ &= (fM \times t1 + P1) - (f1 \times t1 + P1) \\ &= (fM - t1) \times t1 \end{aligned}$$

The output ΔK2 of the subtractor 21 may involve the factor of the duration t1 which corresponds to the PCR insertion interval, in addition to the factor (fM−f1), which is the difference between the transmitted and received system clock frequencies. So, by calculating the PCR insertion interval in the compensator 31 and multiplying the output ΔK2 of the subtractor 21 with its reciprocal as a compensation coefficient, the factor of the PCR insertion interval is removed and the count of the subtractor 21 is normalized. The normalized output ΔM2 of the compensator 31 given by the following equation:

$$\begin{aligned} \Delta M2 &= \Delta K2 \times \{1/t1\} \quad (4\text{-}5) \\ &= (fM - t1) \times t1 + (1/t1) \\ &= fM - t1 \end{aligned}$$

The output ΔK2 of the compensator 31 obtained as described above has a value depending only on the difference between the transmitted and received system clock frequencies. If the VCXO 23 is controlled by the output ΔM2 of the compensator 31 passed through the low-pass filter 22, it is possible to match the transmitted and received system clock frequencies with each other immediately after the time (D).

When the PCR P2 is loaded on the counter 19 after both of the transmitted and received system clocks are matched with each other immediately after the time (D), the difference between the PCR and the counter output becomes 0. The phase difference also can be removed at the same time. So, it is possible to match the transmitted and received system clock frequencies and phases with each other immediately after the time (D).

Further, as described above, the output of the subtractor 21, which corresponds to the difference between the PCR and the counter output, is normalized in the compensator 31 to a value which depends only on the difference between the transmitted and received system clock frequencies. Thus, it becomes always possible to accurately control the VCXO 23.

Therefore, according to the arrangement of this embodiment, is the PCRs are continuously loaded in the counter twice, the transmitted and received system clock frequencies and phases can be matched with each other at the second loading operation, and it becomes possible to reduce the time required for locking the received frequency and the phase of the system clock. At the same time, also it becomes always possible to accurately control the VCXO 23 when the difference between the PCR and the counter output is compensated in accordance with a PCR insertion interval.

Although the fourth embodiment described above is a combination of the first and the second embodiments, it is also possible to construct an embodiment by combining the first embodiment with the third embodiment by replacing the compensator 31 with the compensator 32 as explained in the third embodiment.

Figure 11:
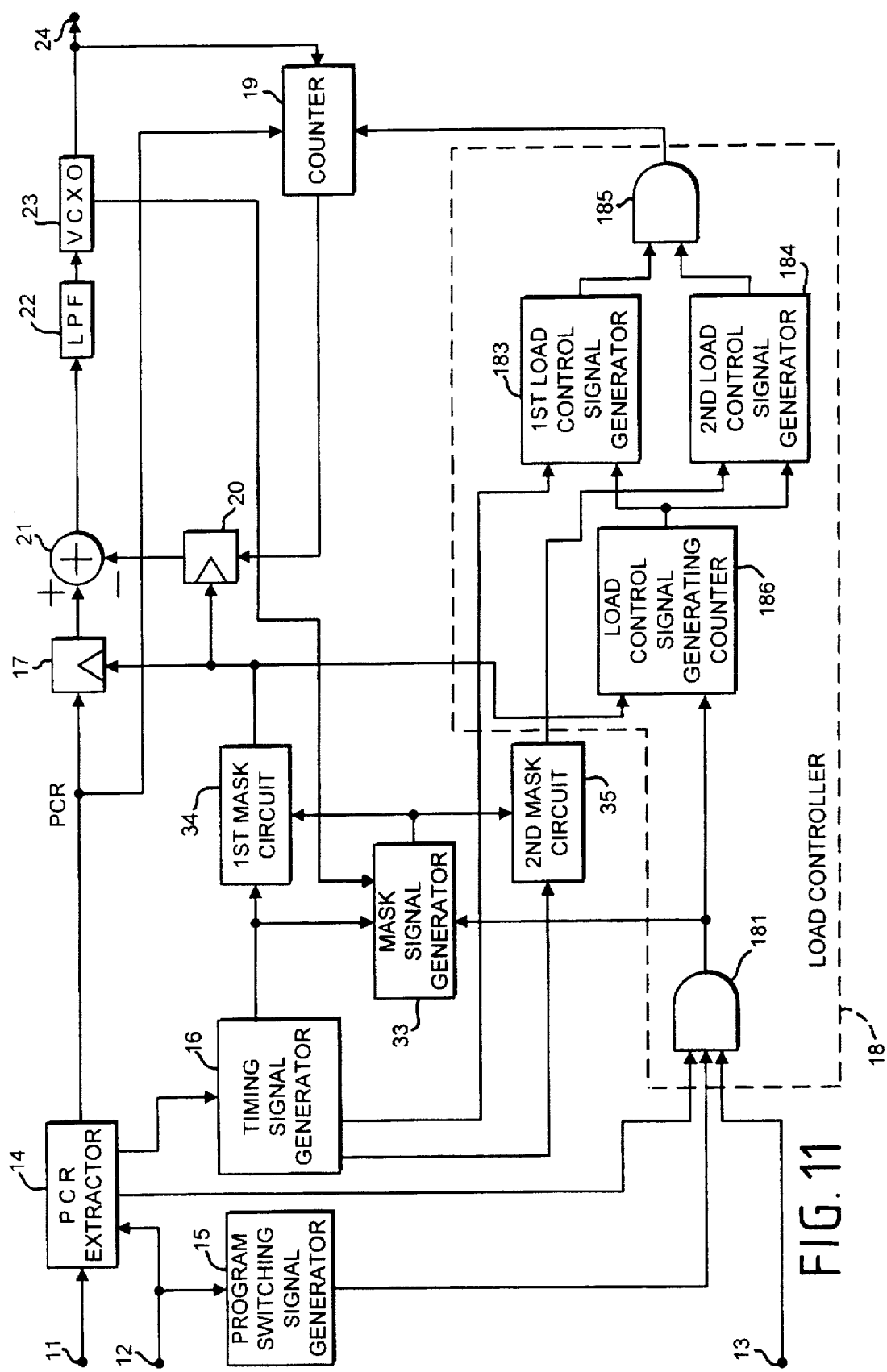
FIG. 11 is a block diagram showing a fifth embodiment of the PLL circuit according to the present invention.

FIG. 11 shows the arrangement of the PLL circuit in a fifth embodiment according to the present invention. In FIG. 11, the same reference numerals are assigned to the same elements as those in FIG. 1 and different elements will be explained here.

In this embodiment, the arrangement of the PLL circuit in the first embodiment for continuously loading PCRs on the counter 19 twice is further provided with a mask signal generator 33 and first and second mask circuits 34 and 35 serving as masking means to skip the PCRs for a fixed period of time when the PCRs are loaded twice.

That is, the timing signal generator 16 in this embodiment generates the master timing signal, the first and the second load timing signals from the PCR field detection signal.

The mask timing signal is transmitted to the master signal generator 33, as well as to the first mask circuit 34. Further, the first load timing signal is transmitted directly to the first load control signal generator 183, but the second load timing signal is transmitted to the second load control signal generator 184 via the second mask circuit 35.

The mask signal generator 33 generates a mask signal from the master timing signal and the output signal of the AND gate 181 of the load controller 18. This mask signal is transmitted to the first and the second mask circuits 34 and 35.

The first mask circuit 34 masks the master timing signal according to the mask signal. Further, the second mask circuit 35 masks the second load timing signal according to the mask signal.

Figure 12:
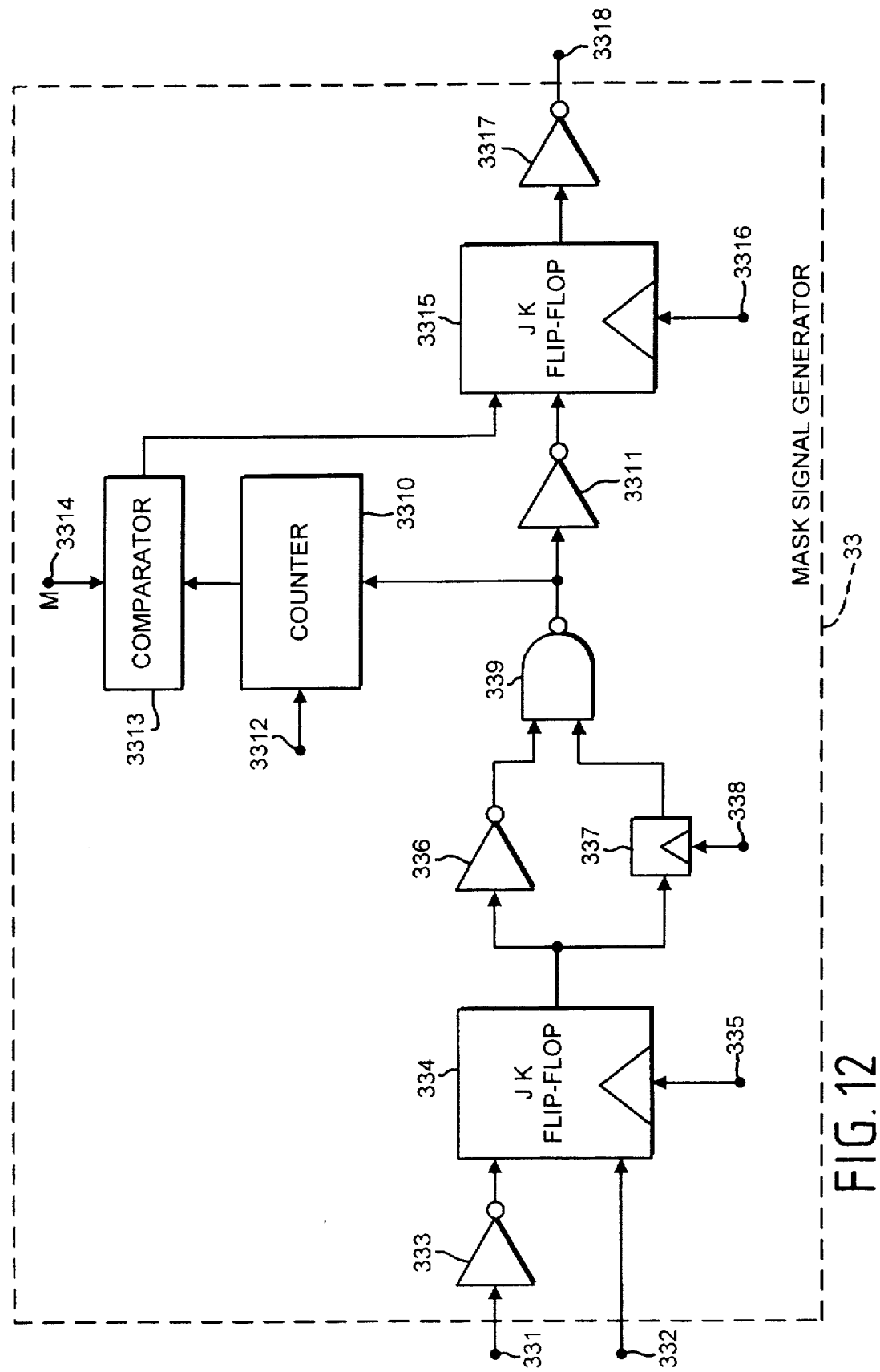
FIG. 12 is a block diagram showing the mask signal generator which is used in the fifth embodiment.

Here, the mask signal generator 33 and the first and the second mask circuits 34, 35 are controlled such that no difference is calculated between the PCRs and the counter outputs for a fixed period of time between the first and second loading operations. The arrangement of the mask signal generator 33 is shown in FIG. 12 and its operation is explained referring to the timing chart shown in FIG. 13.

The output signal of the AND gate 181 shown in FIG. 13(a) is input through a terminal 331. The output signal is inverted by an inverted 333 and then applied to a JK flip-flop 334. Further, the master timing signal shown in FIG. 13(b) is applied to a JK flip-flop 334 through a terminal 332. Here, system clocks which are output from the VCXO 23 are input through terminals 335, 338, 3316 and 3312.

The output of the JK flip-flop 334, as shown in FIG. 13(c), is applied to an inverter 336 and a latch 337. The signal, as shown in FIG. 13(c), changes to a low level single pulse signal, as shown in FIG. 13(d), by the circuit comprising the inverter 336, the latch 337 and a NAND gate 339.

Hereafter, the signal, as shown in FIG. 13(d), is applied to a counter 3310 as a reset signal. The counter 3310 performs count operations until it reaches to a threshold value M which is applied through a terminal 3314, as shown in FIG. 13(e). When the count of the counter 3310 has reached the threshold value M, a comparator 3313 generates a high level pulse, as shown in FIG. 13(f).

The output signal from the comparator 3313 and the output signal from an inverter 3311, which is the inverted logic of the output of the NAND gate 338, are applied to a JK flip-flop 3315 and changes to the signal shown in FIG. 13(g). This output of the JK flip-flop 3315 is inverted by an inverter 3317 and then transmitted to the mask circuits 34, 35 through an output terminal 3318 as a mask signal.

Figure 13:
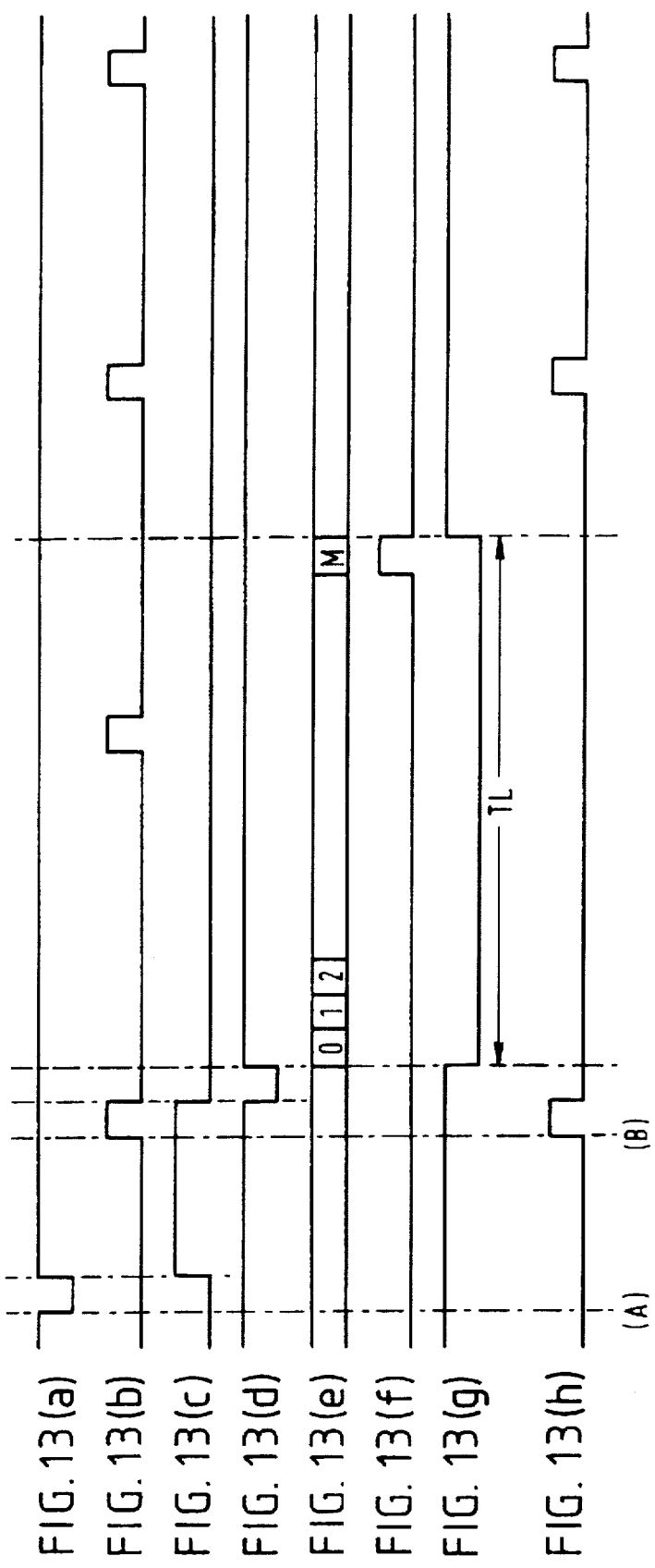
FIGS. 13(a)–13(h) is a timing chart for explaining the operation of the mask signal generator shown in FIG. 12.

In FIG. 13, the time (A) where the output signal of the AND gate 181 drops to the low level shows whether a program has been switched, the power source has been turned ON or a time base has been switched.

Hereafter, the first loading operation is performed immediately before the time (B) where the master timing signal shown in FIG. 13(b) first has the high level. After the first loading operation, it is necessary to mask the master timing signal so as not to calculate the difference between the PCR and the counter output for a fixed period of time TL. For this purpose, the threshold value M should be given by the following equation (5-1). Here, f1 shows the received system clock frequency after the first loading operation.

$$\Delta M = f1 \times TL \quad (5-1)$$

When the threshold value M is set as shown by the equation (5-1), the low level period of the mask signal shows the period TL when the difference between the PCR and the counter output is not calculated. If this mask signal is applied, for instance, to the mask circuit 34 comprising an AND gate, it becomes possible to make the master timing signal at a low level only for the period TL shown in FIG. 13. So, it is possible to output the masked master timing signal (see FIG. 13(h)) from the mask circuit 34 only for the period TL. Further, the operation similar to the mask circuit 34 is also performed in the mask circuit 35.

Next, how the second loading operation is controlled by skipping PCRs for a fixed period of time after the first loading operation will be explained referring to a timing charge shown in FIGS. 14(a) through 14(q).

FIG. 14(a) shows a transport stream which is input through a terminal 11. User-selected program PCRs have been inserted in this transport stream at locations P1, P2, P3 and P4.

This transport stream is applied to the PCR extractor 14, wherein the PCR field detection signal shown in FIG. 14(b) is generated. This PCR field detection signal in synchronism with the transport stream shows the portions of the transport stream where PCRs have been inserted and stays at a low level in the periods when PCRs have been inserted, i.e., for the durations of P1, P2, P3 and P4 of the transport stream shown in FIG. 14(a). This PCR field detection signal is applied to the timing signal generator 16.

Further, in the PCR extractor 14 the user-selected program PCRs P1, P2, P3 and P4 inserted in the transport stream shown in FIG. 14(a) have been extracted as shown in FIG. 14(c). The extracted PCRs are applied to the latch 17 and the counter 19.

The master timing signal shown in FIG. 14(d) is generated in the timing signal generator 16 based on the PCR field detection signal shown in FIG. 14(b). This master timing signal is calculated from an AND operation with the mask signal (FIG. 14(e)) output from the mask signal generator 33 in the mask circuit 34 comprising, for instance, an AND gate and is forced to drop to a low level and masked for the period TL only. As a result of the masking for the period TL, the master timing signal changes to the signal shown in FIG. 14(f).

The PCRs, as shown in FIG. 14(c), output from the PCR extractor 14 are latched in the latch 17 by the masked master timing signal, as shown in FIG. 14(g), and then applied to the subtractor 21.

Here, assuming that the output signal of the AND gate 181 generates a low level pulse at the timing (A) shown in FIG. 14(h) in the load controller 18. The low level pulse shows whether a program has been switched, the power source has been turned ON or a time base has been switched. The pulse is then applied to the load control signal generating counter 186.

The masked master timing signal is applied to the load control signal counter 186 as a clock, while the output signal of the AND gate 181 is input as a reset signal. That is, this counter 186 is reset when the output signal of the AND gate 181 drops to the low level. Thereafter, when the reset is canceled, the counter counts up successively at every leading edge of the master timing signal which operates as a clock input. So, the output of the load control signal generating counter 186 changes as shown in FIG. 14(i). The output of this counter 186 is applied to the first and the second load control signal generators 183 and 184.

Figure 14:
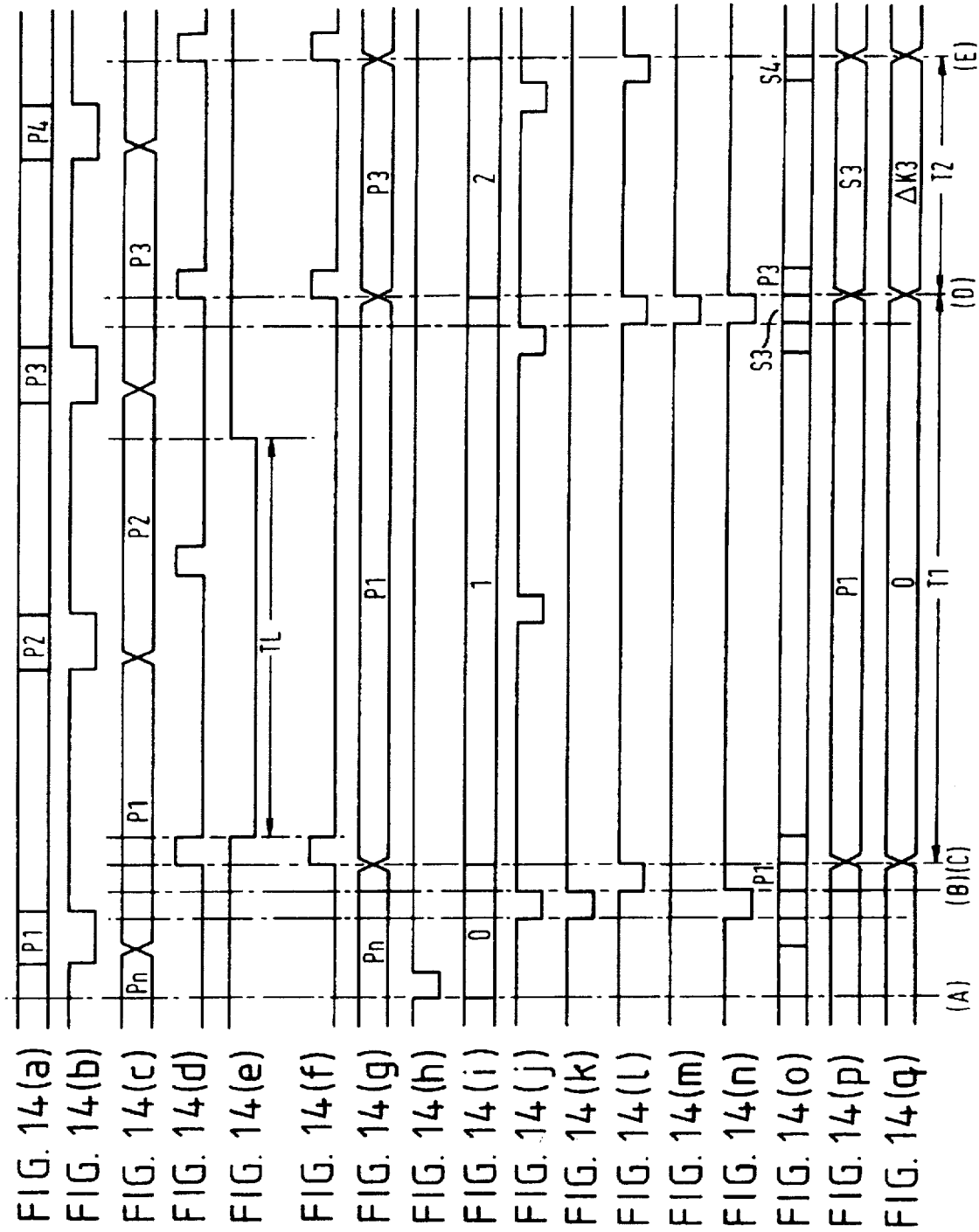
FIGS. 14(a)–14(Q) is a timing chart for explaining the operation of the fifth embodiment.

To the first load control signal generator 183, the first load timing signal shown in FIG. 14(i j) and the output signal of the load control signal generating counter 186 shown in FIG. 14(i) are input.

The first load timing signal shown in FIG. 14(j) is generated in the timing signal generator 16 based on the PCR field detection signal shown in FIG. 14(b) and PCRs are loaded on the counter 19 in the low level period. The first load control signal generator outputs the signal shown in FIG. 14(k). This signal is a signal through the first load timing signal only in the period when the output signal of the load control signal generating counter 186 is 0 and is at the high level in the period of other values.

Further, the masked second load timing signal shown in FIG. 14(l) and the output signal of the load control signal generating counter 186 shown in FIG. 14(i) are input to the second load control signal generator 184.

The second load timing signal shown in FIG. 14(l) is the signal generated based on the PCR field detection signal shown in FIG. 14(b) in the timing signal generator 16 and is masked by the mask signal using the mask circuit 35 in the same technique as in the mask circuit 34, and is forced at the high level only during the period TL. Further, the load timing of this second load timing signal is to load PCRs on the counter 19 in the low level period.

Therefore, the second load control signal generator 184 outputs the signal shown in FIG. 14(m). This signal passes through the second load timing signal only during the period when the output signal of the load control signal generating counter 186 is 1 and is at the high level.

The first load control signal shown in FIG. 14(k) and the second load control signal shown in FIG. 14(m are applied to the AND gate 185, and the load control signal shown in FIG. 14(n) is obtained by the AND operation. This load control signal controls the loading operation to the counter 19, and the loading operation to the counter 19 is allowed when this load control signal is at the low level.

In the example shown in FIG. 14, the load control signal is at the low level immediately before the times (B) and (D). On the other hand, the outputs of the PCR extractor 14 in this period shown in FIG. 14(c) are P1 at the time (B) and P2 at the time (D) and these values are loaded on the counter 19.

Here, the loading operation at the time (B) is the first loading operation. Thereafter, the PCR which is transmitted for more than the fixed period of time TL is loaded for the second operation. In FIG. 14, a PCR first transmitted after more than a fixed period of time TL is P3 and this P3 is loaded on the counter 19 immediately before the time (D).

The values of P1 and P3 loaded on the counter 19 are output immediately after the times (B) and (D) as the counts of the counter 19 as shown in FIG. 14(c). That is, after outputting P1 which is a value of PCR loaded immediately after the time (B), the counter 19 performs the counting until it outputs P3 immediately before the time (D), P3 being a value of PCR loaded again immediately after the time (D). Thereafter the counting is successively performed.

The counts of the counter 19 shown in FIG. 14(c) are latched by the masked master timing signal (see FIG. 14(f)) in the latch 20, thus changing the counts to the signal shown in FIG. 14(p) which are then applied to the subtractor 21.

In this subtractor 21, a difference between the output of the latch 17 shown in FIG. 14(g) and the output of the latch 20 shown in FIG. 14(p) is calculated. In the period t1, since it is immediately after PCRs have been loaded on the counter 19, the output of the latch 17 (see FIG. 14(g)) and that of the latch 20 (see FIG. 14(p)) are both the same P1 and therefore, the output of the subtractor 21 becomes 0.

Hereafter, the output 0 of the subtractor 21 passes through the load-pass filter 22 and controls the VCXO 23. In the period T1, the VCXO 23 outputs a system clock having the frequency f1 corresponding to the output 0 of the subtractor 21 passed through the low-pass filter 22.

Here, it is assumed that the transmitter system clock frequency is presented by fM. In the period T1, as the counter 19 runs under a control of a system clock having frequency f1, a difference equivalent to a difference between transmitted and received system clock frequencies fM and f1 is generated between the output 83 of the counter 19 immediately before the time (D) and the PCR P3. Therefore, the output of the subtractor 21 takes the value ΔK3.

Here, assuming that the duration of the period T1 is t1, the values P3, S3 and ΔK3 may be expressed by the following equations (5-2), (5-3) and (5-4):

$$P3 = fM \times t1 + P1 \quad (5\text{-}2)$$

$$S3 = f1 \times t1 + P1 \quad (5\text{-}3)$$

$$\begin{aligned}\Delta K3 &= P3 - S3 \\ &= (fM \times t1 + P1) - (f1 \times t1 + P1) \\ &= (fM - f1) \times t1\end{aligned} \quad (5\text{-}4)$$

Since the value of ΔK3 shown by equation (5-4) is an integer, although a value of t1 is too small and a difference fM−f1 between transmitted and received system clock frequencies has a certain amount of value, if the ΔK3 satisfies a condition; −1<ΔK3<1, ΔK3 becomes 0 by omitting values to the right of the decimal point. Therefore, even when PCRs are loaded twice, a difference between transmitted and received system clocks cannot be removed.

So, when a difference between transmitted and received system clocks is above a certain level, it is necessary to set t1 so that the ΔK3 satisfies a condition; ΔK3≧1 or ΔK3≦−1. The threshold value of this t1 is the period TL which masked the master timing signal, and if a difference is calculated first after this period TL is exceeded, a relation ΔK3≠0 is obtained.

ΔK3 is a value resulting from the difference in the transmitted and received system clock frequencies. Therefore, if the VCXO 23 is controlled by passing ΔK3 through the low-pass filter 22, it is possible to bring a system clock frequency obtained from the VCXO 23 to a value close to the transmitter system clock frequency fM.

Thereafter, when the PCR P3 is loaded on the counter 19 immediately after the time (D), a deviation between transmitted and received system clocks can be eliminated. So, as transmitted and received system clock frequencies and phases are very close to each other at the time immediately after the time (D), not much time is required hereafter to lock the received frequency and the phase of the system clock.

Therefore, according to the arrangement of the PLL circuit in the embodiment described above, when loading PCRs on the counter twice continuously, if more than a fixed period of time is left between the first and second loading operations, it is possible to detect a difference between transmitted and received system clock frequencies positively. Since the VCXO 23 is controllable by this difference is transmitted and received system clock frequencies, it is possible to nearly match transmitted and received system clock frequencies and phases with each other at the second loading operation and reduce a time required for locking the received frequency and the phase of the system clock.

Figure 15:
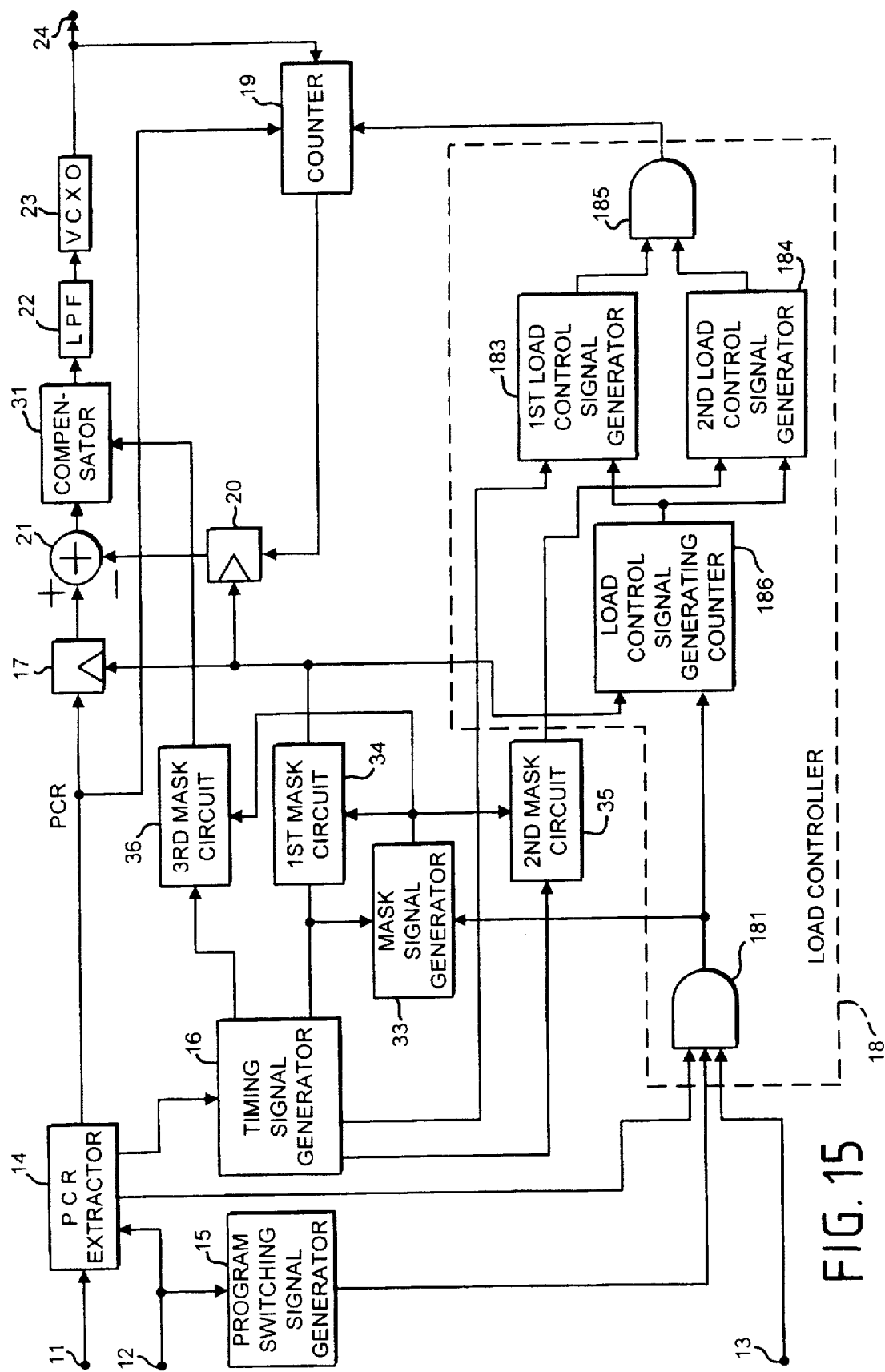
FIG. 15 is a block diagram showing a sixth embodiment of the PLL circuit according to the present invention.

FIG. 15 shows the arrangement of a PLL circuit involved in a sixth embodiment according to the present invention. In FIG. 15, the same reference numerals will be assigned to the same elements as in FIGS. 3 and 11, and different elements will be explained here.

This embodiment is a combination of the second and the fifth embodiments and is provided with a means for loading PCRs twice continuously and skipping PCRs for a fixed period of time between the first and second loading operations and means to compensate and normalize a difference between PCRs and counts.

That is, the timing signal generator 16 generates the master timing signal, the first and the second load timing signals, and the compensation timing signal. The master timing signal is applied to the mask signal generator 33 and the first mask circuit 34, the first load timing signal is applied to the first load control signal generator 183, the second load timing signal is applied to the second mask circuit 35, and the compensation timing signal is applied to a third mask circuit 36.

In the mask signal generator 33, a mask signal is generated from the master timing signal and the output signal of the AND gate of the load controller 18. This mask signal is applied to the first through the third mask circuits 34 through 36.

The first mask circuit 34 masks the master timing signal according to the mask signal. The second mask circuit 35 masks the second load timing signal according to the mask signal. The third mask circuit 36 masks the compensation timing signal.

On the other hand, a difference between PCR and count, which is output from the subtractor 21, is applied to the compensator 31. The compensator 31 compensates the difference, which is the output of the subtractor 21, to reflect a PCR insertion interval and normalize the difference. The masked compensation timing signal rises synchronizing with the timing to calculate a difference between PCR and count. So, it is possible to obtain a PCR insertion interval by measuring pulse intervals of the masked compensation timing signal in the compensator 31 and compensate a difference, which is the output of the subtractor 21, in accordance with this PCR insertion interval.

The operation of the PLL circuit with the arrangement described above will be explained referring to a timing chart shown in FIG. 16.

FIG. 16(a) shows a transport stream which is input through the terminal 11. In this transport stream, user-selected program PCRs have been inserted at the locations P1, P2, P3 and P4.

This transport stream is applied to the PCR extractor 14, wherein the PCR field detection signal shown in FIG. 16(b) is generated. This PCR field detection signal in synchronism with the transport stream shows the portions of the transport stream in which PCRs have been inserted and is at the low level in the periods in which PCRs have been inserted, that is, the periods P1, P2, P3 and P4 of the transport stream shown in FIG. 14(a). This PCR field detection signal is applied to the timing signal generator 16.

Further, in the PCR extractor 14, P1, P2, P3 and P4 which are user-selected program PCRs inserted in the transport stream shown in FIG. 16(a) have been extracted. The extracted PCRs are applied to the latch 17 and the counter 19.

In the timing signal generator 16, the master timing signal shown in FIG. 16(d) is generated based on the PCR field detection signal shown in FIG. 16(b). This master timing signal is calculated for AND (Logical product) with the mask signal (see FIG. 16(e)) output from the mask signal generator 33 in the mask circuit 34 comprising, for instance, an AND gate. The master timing signal is forced to drop to the low level and is masked only for the period TL. As a result of the masking for the period TL, the master timing signal changes as shown in FIG. 16(f).

PCRs, the outputs of the PCR extractor 14 shown in FIG. 16(c), are latched in the latch 17 by the masked master timing signal shown in FIG. 16(f), and the outputs change as shown in FIG. 16(g) and are then applied to the subtractor 21.

Here, it is assumed that the output signal of the AND gate 181 generated a low level pulse in the load controller 18 at the timing (A) shown in FIG. 16(h). This pulse shows whether a program has been switched, the power source has been turned ON or a time base has been switched and is applied to the load control signal generating counter 186.

The masked master timing signal is input as a clock and the output signal of the AND gate 181 is input as a reset signal to the load control signal generating counter 186. That is, this counter 186 is reset when the output signal of the AND gate 181 drops to the low level. Thereafter, when the reset is canceled, the counter performs the counting successively in every leading edge of the master timing signal which operates as a clock input. So, the output of the load control signal generating counter 186 will change as shown in FIG. 16(i). The output of this counter 186 is applied to the first and the second load control signal generators 183 and 184.

The first load timing signal shown in FIG. 16(j) and the output signal of the load control signal generating counter 186 shown in FIG. 16(i) are applied to the first load control signal generator 183.

The first load timing signal shown in FIG. 16(j) is generate based on the PCR field detection signal shown in FIG. 16(b) in the timing signal generator 16 and has a time for loading PCR on the counter 19 at a timing when it is at the low level. The first load control signal generator 183 outputs the signal shown in FIG. 16(k). This signal passes through the first load timing signal only during the period when the output signal of the load control signal generating counter 186 is 0 and is at the high level during the period of other values.

Further, the masked second load timing signal shown in FIG. 16(l) and the output signal of the load control signal generating counter 186 shown in FIG. 16(i) are input to the second lead control signal generator 184.

The second load timing signal shown in FIG. 16(l) is the signal generated based on the PCR field detection signal shown in FIG. 16(b) in the timing signal generator 16 and masked by the mask signal in the mask circuit 35, and is forced at the high level only during the period TL. Further, this second load timing signal has a timing for loading PCR on the counter 19 in the period when it is at the low level.

Therefore, the second load control signal generator 184 outputs the signal shown in FIG. 16(m). This signal passes through the second load timing signal only when the output signal of the load control signal generating counter 186 has 1 and is at the high level in the period when it is other values.

The first load control signal shown in FIG. 16(k) and the second load control signal shown in FIG. 16(m) are applied to the AND gate 185 and the load control signal shown in FIG. 16(n) is obtained as a result of their AND operation. This load control signal controls the loading operation to the counter 19 and when this load control signal is at the low level, the loading operation to the counter 19 is allowed.

Figure 16:
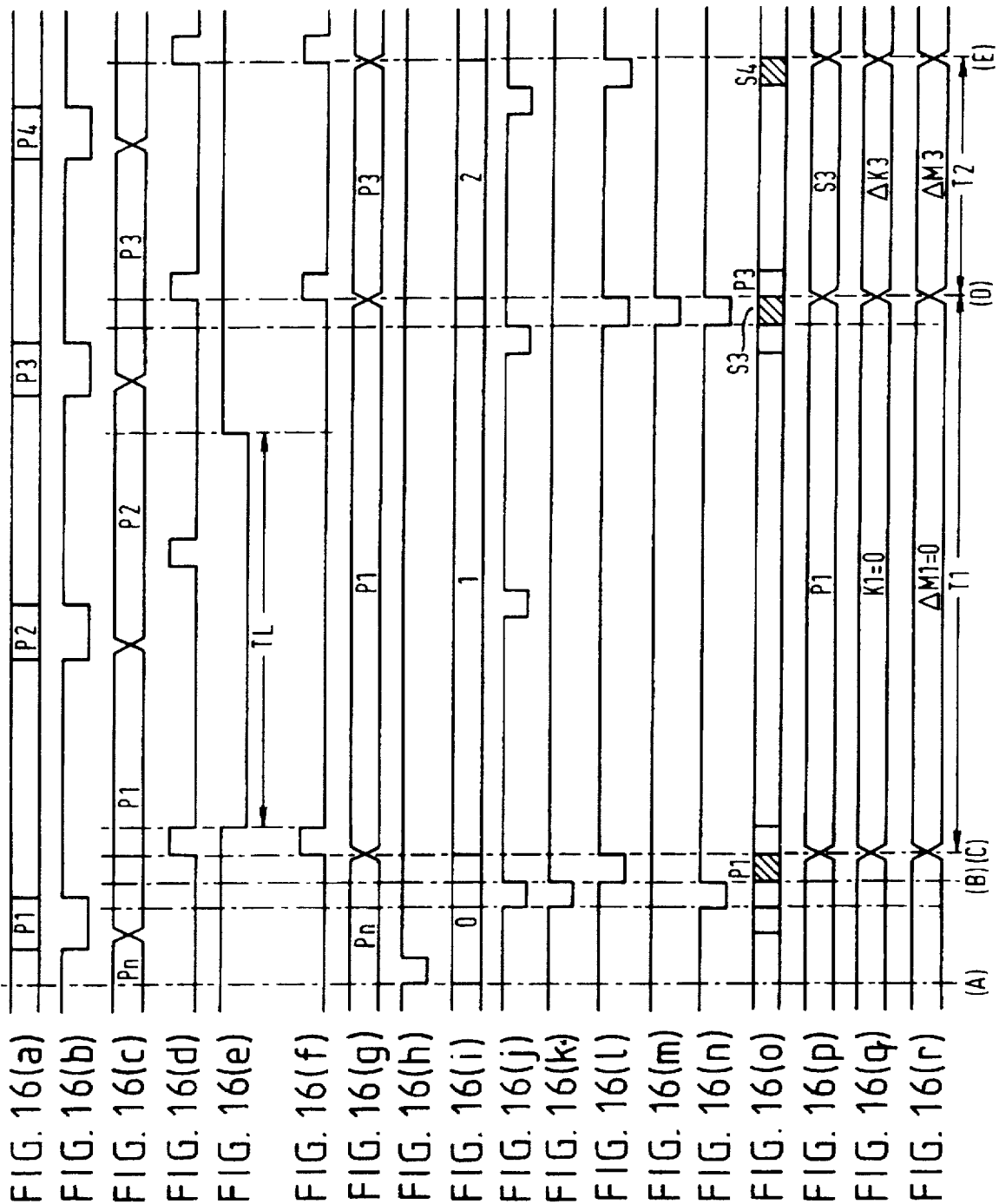
FIGS. 16(a)–16(R) is a timing chart for explaining the operation of the sixth embodiment.

In the example shown in FIG. 16, the load control signal is at the low level immediately before the times (B) and (D).

On the other hand, the output of the PCR extractor 14 shown in FIG. 16(c) in this period are P1 and P3 at the times (B) and (D), respectively and these values are loaded on the counter 19.

Here, PCR is loaded at the time (B) for the first time. Thereafter, PCR transmitted later after more than a fixed period of time TL is loaded for the second time. In FIG. 16, a value of PCR transmitted for the first time more than a fixed period of time TL later is P3, and this P3 is loaded immediately before the time (D).

The values of P1 and P3 loaded on the counter 19 are output immediately after the times (B) and (D), respectively as the counts of the counter 19 as shown in FIG. 16(o). That is, after outputting P1, the value of PCR is loaded immediately after the time (B), the counter 19 counts up successively until outputting S3 immediately before the time (D) and output P3, the value of PCR is loaded again immediately after the time (D) and counts up continuously.

The output of the counter 19 shown in FIG. 16(c) is latched by the masked master timing signal (see FIG. 16(f)) in the latch 20, thus changing to the signal shown in FIG. 16(p), and is then applied to the subtractor 21.

In this subtractor 21, a difference between the output of the latch 17 shown in FIG. 16(g) and the output of the latch 20 shown in FIG. 16(p) is calculated. In the period t1, as it is immediately after PCRs values have been loaded on the counter 19, the output of the latch 17 (see FIG. 16(g)) and that of the latch 20 (see FIG. 16(p)) are both the same P1 and the output of the subtractor 21 (see FIG. 16(q)) is 0 as shown by the following equation (6-1)

$$\Delta K1 = P1 - P1 = 0 \tag{6-1}$$

Hereafter, the output of the subtractor 21 $\Delta K1=0$ will be 0 even when multiplied with a compensation coefficient in the compensator 31. The output $\Delta M2=0$ of the compensator 31 controls the VCXO 23, passing through the low-pass filter 22. In the period T1, the VCXO 23 outputs a system clock having frequency f1 corresponding to the output 0 of the compensator 31 passed through the low-pass filter 22.

Here, the transmitter system clock frequency is presented by fM. In the period T1, since the counter 19 operates at a system clock having frequency f1, a difference equivalent to a difference between transmitted and received system clock frequencies fM and f1 is produced between the output 63 of the counter 19 immediately before the time (D) and a PCR 3. This is expressed by the following equations (6-2) and (6-3) when the period T1 has the duration t1

$$P3 = fM \times t1 + P1 \tag{6-2}$$

$$S3 = f1 \times t1 + P1 \tag{6-3}$$

From the above, the output $\Delta K3$ of the subtractor 19 in the period T2 is as expressed by the equation (6-4).

$$\begin{aligned}\Delta K3 &= P3 - S3 \\ &= (fM \times t1 + P1) - (f1 \times t1 + P1) \\ &= (fM - f1) \times t1\end{aligned} \tag{6-4}$$

Since the value of $\Delta K3$ shown by the equation (6-4) is an integer, if the values of t1 is too small, a difference between the transmitted and received system clock frequencies expressed by fM−f1, if any, will be a decimal value less than 1 and will be discarded if the condition $-1=\Delta K3<1$ is satisfied. Then the $\Delta K3$ becomes 0. So, a difference between transmitted and received system clocks cannot be eliminated even when PCRs are loaded twice.

So, if a difference between transmitted and received system clocks is higher than a certain level, it is necessary to set t1 so that the value of ΔK3 satisfies the condition ΔK3≧1 or ΔK3≦−1. This threshold value t1 lasts for the period TL in which the master timing signal is masked. If a difference is calculated when this period TL has expired, a relation of ΔK3≠0 is obtained if the difference between the transmitted and received system clock frequencies higher than a sufficient level.

This ΔK3 takes a value resulting from the difference between the transmitted and received system clock frequencies in the period T1. Further, the output ΔK3 of the subtractor 21 involves a time factor t1 corresponding to a PCR insertion interval, in addition to the factor of (fM−f1) corresponding to the difference between the transmitted and received system clock frequencies.

So, the factor of PCR insertion interval is removed and the output of the subtractor 19 is normalized by calculating the PCR insertion interval and multiplexing the output ΔK3 of the subtractor 21 with the reciprocal of the PCR inserting distance calculated as a compensation coefficient in the compensator 31. The output of the compensator 31 is shown in FIG. 16(r). Further, the normalized output ΔM3 of the compensator 31 is expressed by the equation (6-5).

$$\Delta M3 = \Delta K3 \times (1/t1) \qquad (6\text{-}5)$$
$$= (fM - f1) \times t1 + \{1/t1\}$$
$$= fM - f1$$

The output ΔK3 of the compensator 31 obtained as described above becomes a value depending on only the transmitted and received system clock frequencies. Therefore, when the VCXO 23 is controlled by the ΔM3 output from the compensator 31 passed through the low-pass filter 22, it is possible to match the transmitted and received system clock frequencies with each other immediately after the time (D).

When the PCR P3 is loaded on the counter 19 after the transmitted and received system clocks have been matched with each other immediately after the time (D), the difference between the PCR and the counter output becomes 0. Also, the phase difference can be removed at the same time. So, it is possible to match the transmitted and received system clock frequencies and phases with each other.

Further, since the output of the subtractor 21, which corresponds to the difference between the PCR and the counter output, is normalized to a value depending on a difference between transmitted and received system clock frequencies as described above, it becomes possible to control the VCXO 23 constantly and accurately.

Therefore, according to the arrangement of the PLL circuit in this embodiment, it is possible to detect a difference between transmitted and received system clock frequencies positively as the second loading operation when more than a fixed period of time is left between the first and the second loading operations for consecutively loading the PCR's and the counter twice.

Further, since the VCXO 23 is controllable by the difference between the transmitted and received system clock frequencies, it is possible to nearly match the transmitted and received system clock frequencies and phases with each other at the second loading operation. Thus, the time required for locking the received frequency and the phase of the system is reduced.

Furthermore, since the difference between the PCR and the counter output is compensated according to the PCR insertion interval, the VCXO 23 can be accurately controlled.

Although the sixth embodiment described above is a combination of the second embodiment and the fifth embodiment, it is also possible to construct another embodiment combining the third and the fifth embodiments by replacing the compensator by the arrangement described in the third embodiment.

Figure 17:
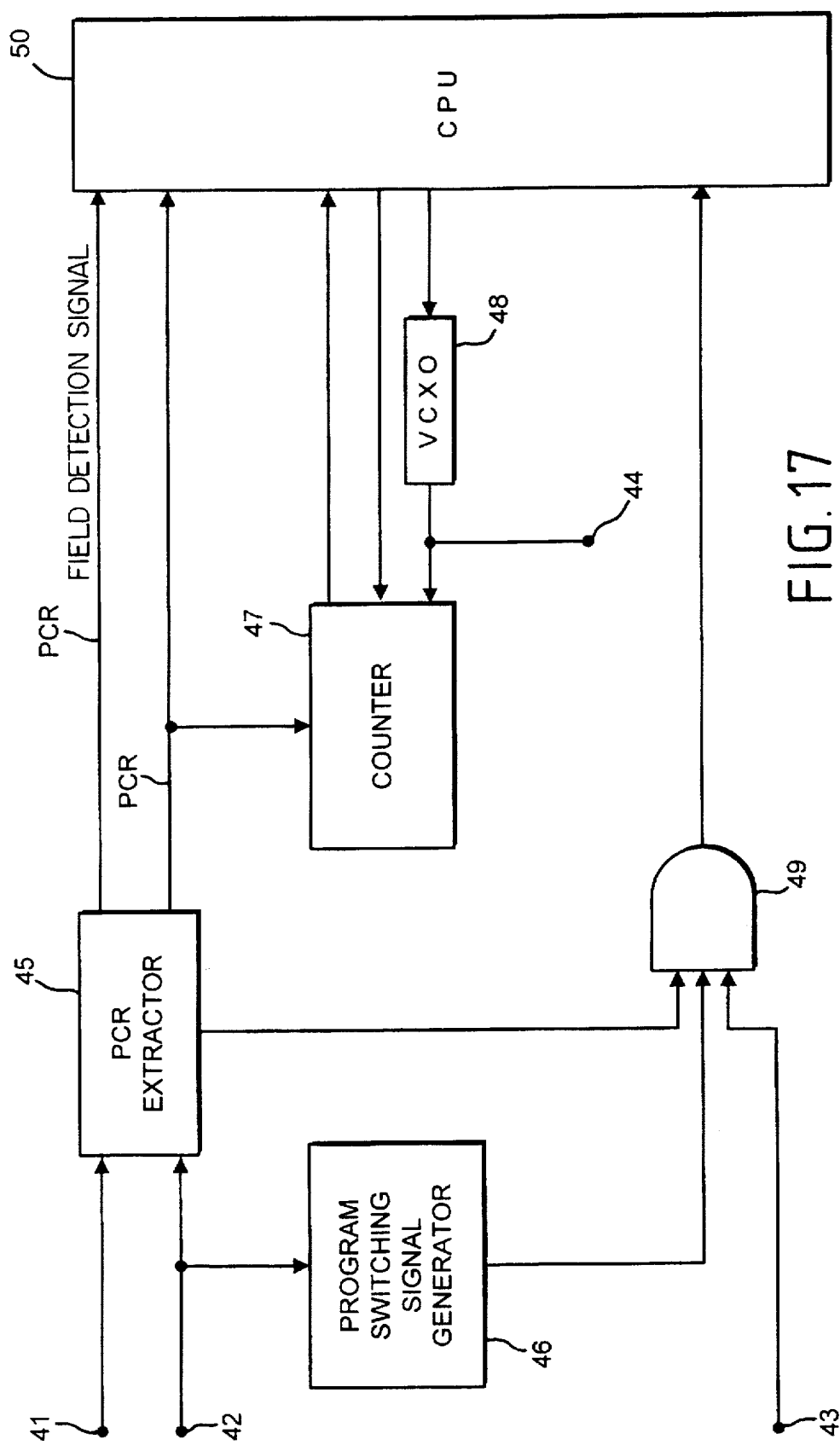
FIG. 17 is a block diagram showing a seventh embodiment of the PLL circuit and system according to the present invention.
Figure 18:
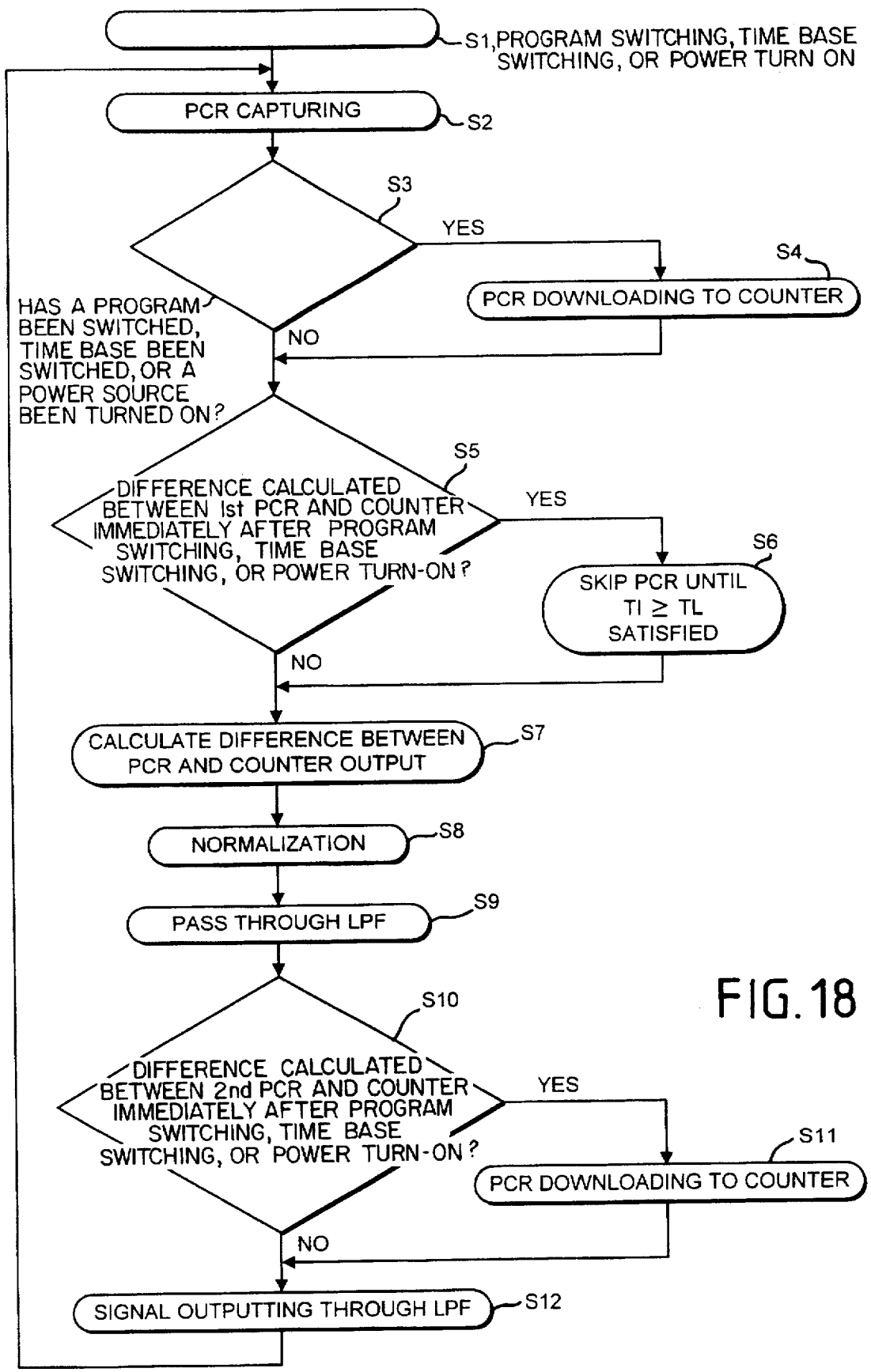
FIG. 18 is a flow chart showing the contents of the process operation of a CPU which is used in the seventh embodiment.

FIG. 17 shows a seventh embodiment of the PLL circuit according to the present invention. This embodiment concerns a software-based processing using the techniques shown in the first through the sixth embodiments applied to the CPU.

In FIG. 17, a transport stream input through a terminal 41 is applied to a PCR extractor 45. A program selection signal input through a terminal 42 is applied to the PCR extractor 45 and a program switching signal generator 46. The program selection signal showing a user-selected program is converted to a program switching signal to generate a pulse at the program switching in the program switching signal generator 46.

Figure 20:
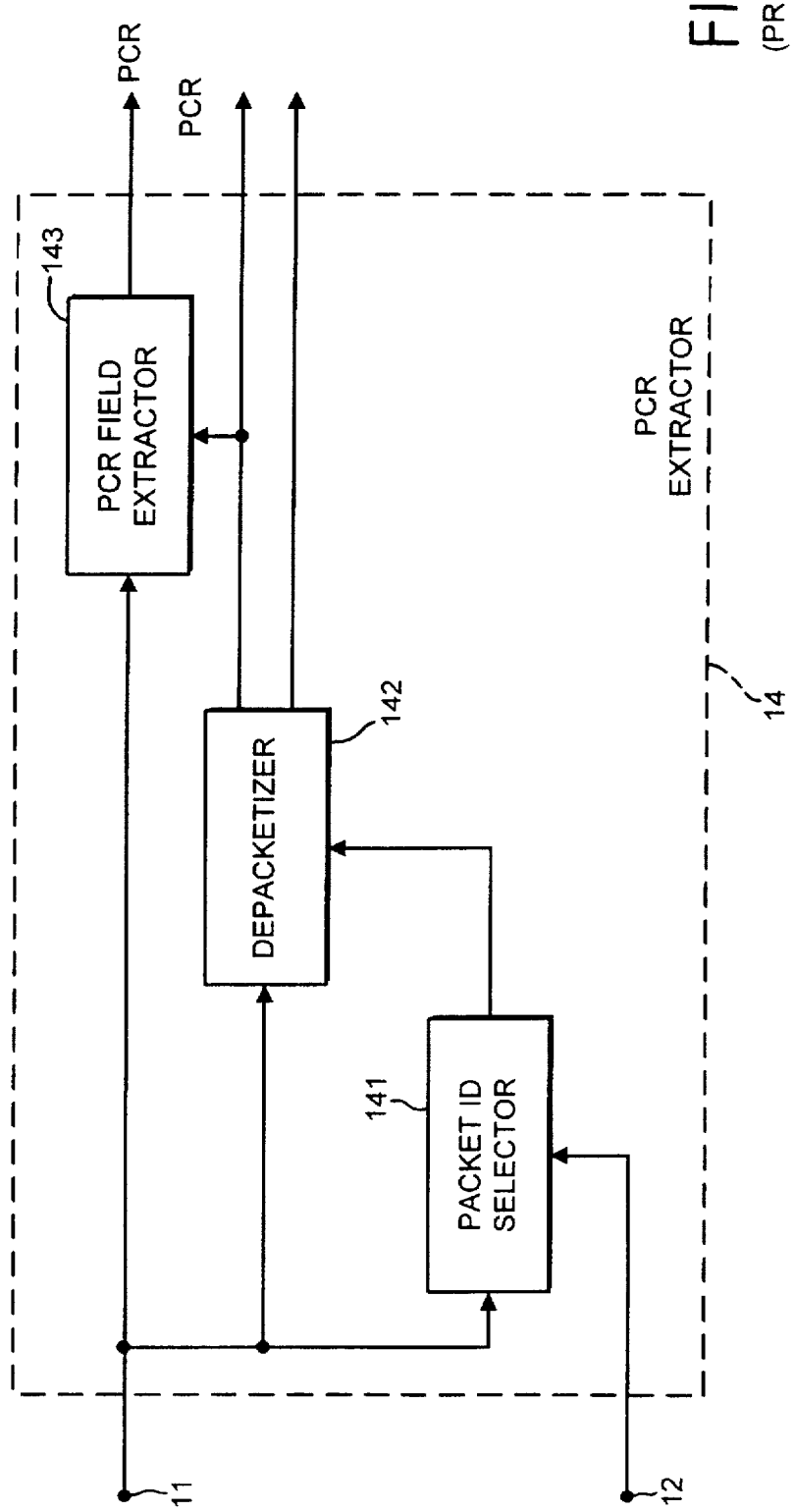
FIG. 20 is a block diagram showing the PLL circuit which is used in the PLL circuit shown in FIG. 19.

The PCR extractor 45 extracts a PCR for programs selected from the transport stream input through the terminal 41 according to the program selection signal, supplies the PCR into a CPU 50 and a counter 47, and at the same time, generates a PCR field detection signal showing locations of the transport stream where the selected program PCRs have been placed and applies the detection signal to the CPU 50 to generate a time base switching signal showing the completion of a time base switching for applying the signal to an AND gate 49. The arrangement of this PCR extractor 45 is the same as that of the PCR extractor 14 of a conventional PLL circuit shown in FIG. 20.

The time base switching signal output from the PCR extractor 45, the program switching signal output from the program switching signal generator 46 and a power ON reset signal which is input through a terminal 43 are applied to the AND gate 49. This AND gate 49 performs an AND operation of a time base switching signal, the program switching signal and the power ON reset signal. The output signal of this AND gate 49 shows whether a program has been switched, a time base has been switched or a power sources has been turned ON and is applied to the CPU 50.

The counter 47 loads the PCRs output from the PCR extractor 45 under a control of a load control signal output from the CPU 50, counts up by a system clock output from a VCXO 48 and applies the count to the CPU 50.

The CPU 50 captures the PCR field detection signal, the PCRs, the counts of the counter 47 and the counts of the AND gate 49 to generate a voltage control signal of the VCXO 48 and a load control signal of the counter 47. The VCXO 48 generates a system clock of frequency corresponding to the voltage control signal output from the CPU 50 and this system clock is applied to the counter 47 and a terminal 44. The system clock applied to the terminal 44 is used for various processing at the receiver.

In the CPU 50, a software-based processing is carried out for consecutively loading the PCR twice, as shown in the sixth embodiment, skipping the PCRs for a fixed period of time between the first and the second loading operations and compensating to normalize the difference between the PCR and the counter output. The software-based processing performed the CPU 50 will be explained in referring to the flowchart shown in FIG. 18.

Immediately after detecting that a program has been switched, a time base has been switched or the power source has been turned ON from the output of the AND gate 49 in the step S1, the CPU 50 executes the step S2 and captures the PCRs output from the PCR extractor 45.

Next, in the decision step S3, after capturing the output signal from the AND gate 49, the CPU 50 judges whether a program has been switched, a time base has been switched or the power source has been turned ON.

First, immediately after a program has been switched or a time base has been switched or the power source has been turned ON, the CPU 50 captures PCR and executes the step S4 according to the result of judgment in the decision step S3. In the step S4, the CPU 50 gives an instruction to allow the loading operation (load control signal) to the counter 4 for loading PCR on the counter 47. This is the first loading operation of PCR on the counter 47.

After loading the PCR on the counter 47, the CPU 50 executes the decision step S5. In the decision step S5, the CPU 50 judges if a difference between the first transmitted PCR and a counter output has been calculated immediately after the program switching, the time base switching or the power source turn-ON.

If the judgment in the decision step S5 is "ON" immediately after the first loading operation of the PCR on the counter 47, the step S7 is executed. In the step S7, the difference between the PCR and the output of the counter 47 is calculated according to the PCR field detection signal which is output from the PCR extractor 45.

The difference between the PCR and the output of the counter 47 is normalized in the step S8. The normalization process includes a process of compensating the difference between the PCR and the output of the counter 47 according to the PCR insertion interval.

The normalized difference between the PCR and the output of the counter 47 is low-pass filtered in the step S9. The normalized and low-pass filtered difference between the PCR and the output of the counter 47 is judged in the decision step S10 as to whether the difference between the second PCR and the output of the counter 47 has been calculated immediately after the program switching, the time base switching or the power source turn-ON.

In this case, as the difference between the PCR and the output of the counter 47 has been calculated after the first loading operation of the PCR on the counter 47 the judgment in the decision step S10 results to "NO". Thus, the step S12 is executed. In the step S12, the output of the low-pass filter is applied to the VCXO 48 for the voltage control of the VCXO 48.

Turning back to the step S2 after outputting the output of the low-pass filter, the second PCR is calculated. Then, the judgment in the decision step S3 is performed. In this case, the judgment is "NO" since it is not immediately after the program switching, and the time base switching or the power source turned ON and the decision step S5 is executed.

The judgment in the decision step S5 is "YES", and the step S6 is executed as a difference between the first transmitted PCR and the output of the counter 47 calculated immediately after the program switching, the time base switching or the power source turned ON after the second PCR has been captured.

Here, the period left between the first and the second loading operations is presented by T1, while the threshold value of the period for skipping the PCR for the period left between the first and the second loading operations is presented by TL. In the step 6, skipping the transmitted PCR continues until the period T1 becomes larger than or equal to threshold value of the period TL (i.e., T1≧TL). When the condition (T1≧TL) is satisfied, the difference between the second PCR and the output of the counter 47 is calculated immediately after the program switching, the time base switching or the power source turn-ON.

Thereafter, a series of processing the steps S8 and S9 are performed and the judgment is made in the decision step S10. In this case, the result of the judgment in the decision step S10 is "YES" and the step S11 is executed as a difference between the second PCR and the output of the counter 47 has been calculated immediately after the program switching, the time base switching or the power source turned ON.

In the step S11, the CPU 50 gives an instruction (load control signal) to allow loading of the PCRs to the counter 47. Thus, the second loading operation of the PCRs to the counter 47 is performed. After the second loading operation of the PCRs to the counter 47, the output of the low-pass filter is applied to the VCXO 48 in the step S12.

After outputting the output of the low-pass filter, the processing turns back to the step S2, and thus the third capturing operation of the PCR is carried out. Thereafter, the operation forwards to the judgment in the decision step S3. In this case, since the result of judgment in the decision step S3 is "NO", the judgment in the decision step S5 is performed. In this case, the result of judgment in the decision step S5 is "NO". Thereafter a series of processing the steps S7, S8 and S9 are performed. Then, the judgment in the decision step S10 is performed. Since the judgment in the decision step S10 is "NO", the step S12 is executed.

After the third capturing operation of the PCRs, a series of the steps S2, S7, S8, S9 and S12 are repeatedly carried out for calculating the difference between the PCR and the output of the counter 47, normalizing the difference and outputting the low-pass filtered difference to the VCXO 48.

Therefore, according to the embodiment of the PLL circuit described above, it is possible to perform similar operations as in the sixth embodiment by performing the software-based processing described above in the CPU 50. So, similar effects as in the sixth embodiment can be achieved. That is, it is possible to reduce a time required for locking the received frequency and phase of the system clock and accurately control the VCXO.

In addition, in the seventh embodiment, the software process in the CPU 50 can be modified in various forms and also, it is possible to perform the operations similar to those described in the first through the fifth embodiments.

Further, the embodiments have been described taking the MPEG2 system as an example but the arrangements described in these embodiments are also applicable to the overall digital transmission technologies other than the MPEG2.

According to the present invention as described above, it is possible to provide a PLL circuit and system which are capable or reducing a time required to lock the received frequency and the phase of the system clock and accurately controlling system clock frequency.

As described above, the present invention can provide an extremely preferable PLL circuit and method.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts. some of which may lie partially or wholly outside the scope of some or all of the following claims. The fact that the applicant has chosen at the time of filing of the present application to restrict the claimed scope of protection in accordance with the following claims is not to be taken as a disclaimer or alterative inventive concepts that are included in the contents of the application and could be defined by claims differing in scope from the following claims, which different claims may be adopted subsequently during prosecution. for example. for the purposes of a divisional application.

What is claimed is:

1. A PLL circuit for use in a digital broadcasting receiver. comprising:

means for receiving a bit stream transmitted from a broadcast station. the bit stream containing a first program clock reference and a second program clock reference (PCR). the first and second PCRs each corresponding with a frequency and phase of a transmitter system clock;

an oscillator coupled with the receiving means for generating a receiver system clock corresponding to a difference between the first and second PCRs. defined as a PCR difference. and a difference between the PCR difference and a counter output. the receiver system clock provided from the oscillator also corresponding to a difference between a frequency and a phase of the receiver system clock and the frequency and the phase of the transmitter system clock;

a counter operating in response to the receiver system clock from the oscillator;

means for applying the bit stream containing the first and second PCRs from the receiving means to the oscillator;

means for controlling the counter using the oscillator so that the counter output matches with the first and second PCRs, wherein the counter is controlled based on differences between the PCR difference and the counter output; and load control means for successively loading the first PCR and the second PCR on the counter in the order of transmission of the first and second PCRs and controlling the frequency and the phase of the receiver system clock provided from the oscillator such that the receiver system clock from the oscillator indicates that the frequency and phase of the receiver system clock is locked with the frequency and phase of the transmitter system clock.

2. A PLL circuit as claimed in claim 1. wherein the load control means stops calculation of the difference between the first PCR in the bit stream and the counter output for a predetermined period of time after the first PCR has been loaded, and the load control means performs a second loading operation for a second PCR transmitted after the predetermined period of time.

3. A PLL circuit as claimed in claim 1. wherein:

the first and second PCRs in the bit stream include a program clock reference base and a program clock reference extension in a transport stream according to ISO/IEC 13818.

the load control means continuously loads the program clock reference base and the program clock reference extension on the counter twice, one time for each of the first and the second PCRs. in their order in the transport stream for locking the frequency and the phase of the receiver system clock provided from the oscillator, and the output of the counter is matched with the program clock reference base and the program clock reference extension through voltage control of the oscillator based on the difference between the PCR difference and the output of the counter.

4. A PLL circuit for use in a digital broadcasting receiver. comprising:

means for receiving a bit stream transmitted from a broadcast station. the bit stream containing a first program clock reference and a second program clock reference (PCR). the first and second PCRs each corresponding with a frequency and phase of a transmitter system clock;

an oscillator coupled with the receiving means for generating a receiver system clock corresponding to a difference between the first and second PCRs. defined as a PCR difference. and the difference between the PCR difference and a first counter output. the receiver system clock provided from the oscillator also corresponding to a difference between a frequency and a phase of the receiver system clock and the frequency and the phase of the transmitter system clock;

a first counter operating in response to the receiver system clock from the oscillator;

means for applying the bit stream containing the first and second PCRs from the receiving means to the oscillator;

means for controlling the first counter using the oscillator so that the counter output matches with the first and second PCRs, wherein the counter is controlled based on differences between the PCR difference and the counter output such that the receiver system clock from the oscillator indicates that the frequency and phase of the receiver system clock is locked with the frequency and phase of the transmitter system clock; and means for compensating for a difference between the PCR difference and the output of the first counter according to insertion intervals of the first and second PCRs in the bit stream.

5. A PLL circuit as claimed in claim 4. wherein the compensation means comprises:

a second counter for obtaining insertion intervals of the first and second PCRs in the bit stream by counting a period until the second counter is reset using a signal indicating the locations of the first and second PCRs inserted in the bit stream;

a coefficient generator for generating a coefficient based on the insertion intervals of the first and second PCRs obtained by the second counter; and a multiplier coupled with the coefficient generator for multiplying the coefficient from the coefficient generator with the difference between the PCR difference and the output of the first counter to generate a normalized difference output which is independent of the insertion intervals of the first and second PCRs.

6. A PLL circuit as claimed in claim 4. wherein the compensation means comprises:

a difference calculating means for calculating the PCR difference between the first and second PCRs extracted from the bit stream;

a coefficient generator for generating the coefficient based on the output of the difference calculating means; and a multiplier for multiplying a difference between the PCR difference and an output of the first counter with a coefficient output from the coefficient generator to generate a normalized difference output which is independent of the insertion intervals of the first and second PCRs.

7. A PLL circuit as claimed in claim 4, wherein:

the first and second PCRs in the bit stream include a program clock reference base and a program clock reference extension in a transport stream according to ISO/IEC 13818, the compensation means compensates for a difference between one of the first and second PCRs and the output of the first counter in accordance with an insertion interval of the program clock reference base and the program clock reference extension in the transport stream, and the output of the first counter is matched with the program clock reference base and the program clock reference extension through voltage control of the oscillator based on the difference between said one of the first and second PCRs and the output of the first counter.

8. A PLL circuit for use in a digital broadcasting receiver, comprising:

means for receiving a bit stream transmitted from a broadcast station, the bit stream containing a first program clock reference and a second program clock reference (PCR), the first and second PCRs each corresponding with a frequency and phase of a transmitter system clock;

an oscillator coupled with the receiving means for generating a receiver system clock corresponding to a difference between the first and second PCRs, defined as a PCR difference, and the difference between the PCR difference and a first counter output, the receiver system clock provided from the oscillator also corresponding to a difference between a frequency and a phase of the receiver system clock and the frequency and the phase of the transmitter system clock;

a first counter operating in response to the receiver system clock from the oscillator;

means for applying the bit stream containing the first and second PCRs from the receiving means to the oscillator;

means for controlling the first counter using the oscillator so that the counter output matches with the first and second PCRs, wherein the counter is controlled based on differences between the PCR difference and the counter output;

load control means for successively loading the first and second PCRs on the first counter in the order of transmission of the first and second PCRs and controlling the frequency and the phase of the receiver system clock provided from the oscillator such that the receiver system clock from the oscillator indicates that the frequency and phase of the receiver system clock is locked with the frequency and phase of the transmitter system clock; and means for compensating for a difference between the PCR difference and the output of the first counter according to insertion intervals of the first and second PCRs in the bit stream.

9. A PLL circuit as claimed in claim 8, wherein:

the first and second PCRs in the bit stream include a program clock reference base and a program clock reference extension in a transport stream according to ISO/IEC 13818, the load control means continuously loads the program clock reference base and the program clock reference extension on the counter twice, one time for each of the first and the second PCRs, in their order in the transport stream for locking the frequency and the phase of the receiver system clock provided from the oscillator, and the compensation means compensates for differences between one of the first and second PCRs and the output of the first counter in accordance with the insertion interval of the program clock reference base and the program clock reference extension in the transport stream, and the output of the first counter is matched with the program clock reference base and the program clock reference extension through voltage control of the oscillator based on the difference between said one of the first and second PCRs and the output of the first counter.

10. A PLL method for use in a digital broadcasting receiver, comprising:

receiving a bit stream transmitted from a broadcast station, the bit stream containing a first program clock reference and a second program clock reference (PCR), the first and second PCRs each corresponding with a frequency and phase of a transmitter system clock;

generating a receiver system clock in an oscillator;

counting the receiver system clocks from the oscillator;

applying the bit stream containing the first and second PCRs from a receiving means to the oscillator;

controlling the counter so that a counter output matches the first and second PCRs based on differences between the first and second PCRs, defined as PCR differences, and differences between the PCR differences and the counter output;

successively loading the first and second PCRs on the counter in the order of transmission of the first and second PCRs; and locking the frequency and the phase of the receiver system clock provided from the oscillator with the frequency and phase of the transmitter system clock using the counter output.

11. A PLL method as claimed in claim 10, wherein the loading step pauses for a predetermined period of time before the loading of the first PCR to calculate the difference between the first PCR in the bit stream and the counter output and wherein the loading step loads a first transmission of the first PCR on the counter after the predetermined period of time has elapsed.

12. A PLL circuit as claimed in claim 10, wherein:

the first and second PCRs in the bit stream include a program clock reference base and a program clock reference extension in a transport stream according to ISO/IEC 13818, the load control step continuously loads the program clock reference base and the program clock reference extension on the counter twice, one time for each of the first and second PCRs, in their order in the transport stream for locking the frequency and the phase of the receiver system clock provided from the oscillator, and outputs of the counter are matched with the program clock reference base and the program clock reference extension through voltage control of the oscillator based on a difference between the PCR difference and the output of the counter.

13. A PLL method for use in a digital broadcasting receiver, comprising:

receiving a bit stream transmitted from a broadcast station, the bit stream containing a first program clock reference and a second program clock reference (PCR), the first and second PCRs each corresponding with a frequency and a phase of transmitter system clock;

generating receiver system clock in an oscillator;

counting the receiver system clocks from the oscillator;

applying the bit stream containing the first and second PCRs from a receiving means to the oscillator;

controlling a first counter so that a first counter output matches the first and second PCRs based on differences between the first PCR and the second PCR, defined as PCR differences, and differences between the PCR differences and the first counter output;

compensating for a difference between the PCR difference and the output of the first counter according to insertion intervals of the first and second PCRs in the bit stream; and controlling the oscillator using the first counter output such that the oscillator output indicates that the frequency and phase of the receiver system clocks are locked with the frequency and phase of the transmitter system clocks.

14. A PLL method as claimed in claim 13, wherein the compensating step comprises:

obtaining the insertion intervals of the first and second PCRs by counting a period until a second counter is reset using a signal showing the inserting locations of the first and second PCRs in the bit stream;

generating a coefficient based on the insertion intervals of the first and second PCRs obtained from the output of the second counter; and multiplying the generating coefficient with the difference between the first and second PCRs in the bit stream and the output of the first counter to generate a normalized difference output which is independent of the insertion intervals of the first and second PCRs.

15. A PLL method as claimed in claim 13, where the compensating step comprises:

consecutively calculating a difference between the first and second PCRs extracted from the bit stream;

generating a coefficient based on the output of the difference calculating means; and multiplying a difference between the first and second PCRs in the bit stream and an output of the first counter with the generated coefficient.

16. A PLL circuit as claimed in claim 13, wherein:

the first and second PCRs in the bit stream include signals having a program clock reference base and a program clock reference extension in a transport stream according to ISO/IEC 13818, the compensation step compensates the differences between one of the first and second PCRs and the output of the first counter in accordance with the insertion interval of the program clock reference base and the program clock reference extension in the transport stream, and the output of the first counter is latched with the program clock reference base and the program clock reference extension through voltage control of the oscillator based on the difference between said one of the first and second PCRs and the output of the first counter.

17. A PLL method for use in a digital broadcasting receiver, comprising:

receiving a bit stream transmitted from a broadcast station, the bit stream containing a first program clock reference and a second program clock reference (PCR), the first and second PCRs each corresponding with a frequency and a phase of a transmitter system clock;

generating receiver system clocks in an oscillator;

counting the receiver system clocks from the oscillator;

applying the bit stream containing the first and second PCRs from a receiving means to the oscillator;

controlling the first counter so that a first counter output matches with the first and second PCRs based on a difference between the first and second PCRs, defined as a PCR difference, and a differences between the PCR difference and the first counter output;

successively loading the first and second PCRs on the first counter in the order of transmission of the first and second PCRs for locking the frequency and the phase of the receiver system clock provided from the oscillator with the frequency and phase of the transmitter system clock using the first counter output; and compensating for a difference between the PCR difference and the output of the first counter according to insertion intervals of the first and second PCRs in the bit stream.

18. A PLL circuit as claimed in claim 17, wherein:

the first and second PCRs in the bit stream include a program clock reference base and a program clock reference extension in a transport stream according to ISO/IEC 13818, the load control step continuously loads the program clock reference base and the program clock reference extension on the first counter twice, one time for each of the first and second PCRs, in their order in the transport stream for locking the frequency and the phase of the receiver system clock from the oscillator with the frequency and phase of the transmitter system clock, the compensation step compensates for a differences between one of the first and second PCRs and the output of the first counter in accordance with the insertion interval of the program clock reference base and the program clock reference in the transport stream; and the outputs of the first counter are matched with the program clock reference base and the program clock reference extension through voltage control of the oscillator based on the difference between the PCR difference and the output of the counter.

* * * * *